United States Patent
Jaiswal et al.

(10) Patent No.: US 11,226,231 B1
(45) Date of Patent: Jan. 18, 2022

(54) IMAGE SENSOR INCORPORATING AN ARRAY OF OPTICALLY SWITCHABLE MAGNETIC TUNNEL JUNCTIONS

(71) Applicant: GLOBALFOUNDRIES U.S. Inc., Malta, NY (US)

(72) Inventors: Akhilesh R. Jaiswal, Falls Church, VA (US); Ajey Poovannummoottil Jacob, Watervliet, NY (US); Yusheng Bian, Ballston Lake, NY (US); David C. Pritchard, Glenville, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 16/911,950

(22) Filed: Jun. 25, 2020

(51) Int. Cl.
*G01J 1/44* (2006.01)
*H01L 43/04* (2006.01)
(Continued)

(52) U.S. Cl.
CPC ........... *G01J 1/44* (2013.01); *H01L 27/22* (2013.01); *H01L 43/04* (2013.01); *H01L 43/06* (2013.01);
(Continued)

(58) Field of Classification Search
CPC ..... G01J 1/44; G01J 2001/4446; H01L 43/06; H01L 43/04; H01L 27/22; H04N 5/374; H04N 5/359; G02F 1/19
See application file for complete search history.

(56) References Cited

U.S. PATENT DOCUMENTS

| 3,488,636 | A | 1/1970 | Dyck |
| 2008/0272302 | A1 | 11/2008 | Frey et al. |

(Continued)

FOREIGN PATENT DOCUMENTS

| DE | 10 2006 019 482 A1 | 10/2007 |
| GB | 1 189 842 A | 4/1970 |

(Continued)

OTHER PUBLICATIONS

Chen et al., "All-Optical Switching of Magnetic Tunnel Junctions with Single Subpicosecond Laser Pulses," American Physical Society, 2017, pp. 1-7.

(Continued)

*Primary Examiner* — Thanh Luu
*Assistant Examiner* — Monica T Taba
(74) *Attorney, Agent, or Firm* — Gibb & Riley, LLC; David A. Cain, Esq.

(57) ABSTRACT

An image sensor includes an array of optically switchable magnetic tunnel junctions (MTJs) arranged in columns and rows. The image sensor has first lines of transparent conductive material and second lines of conductive material. Each first line is in contact with the free layers of the MTJs in a corresponding row. Each second line is electrically connected to the fixed layers MTJs in a corresponding column. The first lines are concurrently exposable to radiation. The first and second lines are selectively biasable. In a global reset operation, biasing conditions are such that all MTJs are switched to an anti-parallel state. In a global sense operation, biasing conditions are such that, depending upon the intensity of radiation received at those portions of the first lines in contact with MTJs, the MTJs may switch to a parallel state. In selective read operations, biasing conditions are such that stored data values in the MTJs can be read.

20 Claims, 14 Drawing Sheets

(51) Int. Cl.
  *H04N 5/374*    (2011.01)
  *H04N 5/359*    (2011.01)
  *H01L 43/06*    (2006.01)
  *G02F 1/19*     (2019.01)
  *H01L 27/22*    (2006.01)

(52) U.S. Cl.
  CPC ............. *H04N 5/359* (2013.01); *H04N 5/374* (2013.01); *G01J 2001/4446* (2013.01); *G02F 1/19* (2013.01)

(56) References Cited

U.S. PATENT DOCUMENTS

| | | | |
|---|---|---|---|
| 2017/0178705 A1* | 6/2017 | Buhrman | ............ G11C 11/1673 |
| 2018/0204867 A1 | 7/2018 | Kim et al. | |

FOREIGN PATENT DOCUMENTS

| | | | | |
|---|---|---|---|---|
| JP | 2016197160 A | * | 11/2016 | |
| WO | 2014206351 A1 | | 12/2014 | |
| WO | WO-2019125388 A1 | * | 6/2019 | ........... H03B 15/006 |
| WO | 2021021690 A1 | | 2/2021 | |
| WO | 2021130796 A1 | | 7/2021 | |

OTHER PUBLICATIONS

Chen et al., "Picosecond All-Optical Switching of Magnetic Tunnel Junctions," Physical Review Applied, 2016, pp. 1-17.

C-SPIN: The Center for Spintronic Materials, Interfaces, and Novel Architectures, "Flipping a Magnetic Memory Cell with a Light Pulse," Accessed on Apr. 22, 2020, pp. 1-2, http://cspin.umn.edu/news/2017/flipping_light_pulse_march2017.html.

Kon-Woo Kwon, "Spin Hall Effect-Based Nonvolatile Flip Flop for Fine-Grained Power Gating," IEIE Transactions on Smart Processing and Computing, vol. 8, No. 5, 2019, pp. 415-422.

Maciel et al., "Magnetic Tunnel Junction Applications," MDPI Sensors, vol. 20, Issue 121, 2020, pp. 1-20.

Moradi et al., "Spin-Orbit-Torque-Based Devices, Circuits and Architectures," Semantic Scholar, 2019, pp. 1-17.

Sam et al., "Investigation of a Magnetic Tunnel Junction Based Sensor for the Detection of Defects in Reinforced Concrete at High Lift-Off," MDPI Sensors, vol. 19, Issue 4718, 2019, pp. 1-10.

Sharad et al., "Ultra Low Energy Analog Image Processing Using Spin Based Neurons," IEEE//ACM International Symposium on Nanoscale Architectures (NANOARCH), 2012, pp. 1-8.

Sorger et al., "Ultra-Compact Silicon Nanophotonic Modulator with Broadband Response," Nanophotonics 1, 17-22, 2012, pp. 1-6.

Srinivasan et al., "Magnetic Tunnel Junction Enabled All-Spin Stochastic Spiking Neural Network," IEEE, Design, Automation and Test in Europe, 2017, pp. 530-535.

Park et al., "A 640 x 640 Fully Dynamic CMOS Image Sensor for Always-On Operation," IEEE Journal of Solid-State Circuits, vol. 55, No. 4, 2020, pp. 898-907.

Kundys et al., "Light Controlled Magnetoresistance and Magnetic Field Controlled Photoresistance in CoFe Film Deposited on BiFeO3," Applied Physics Letters, 100(26), 2012, pp. 1-5.

DE Application No. 10 2021 108 242.0, Office Action Communication dated Oct. 24, 2021, pp. 1-5.

\* cited by examiner

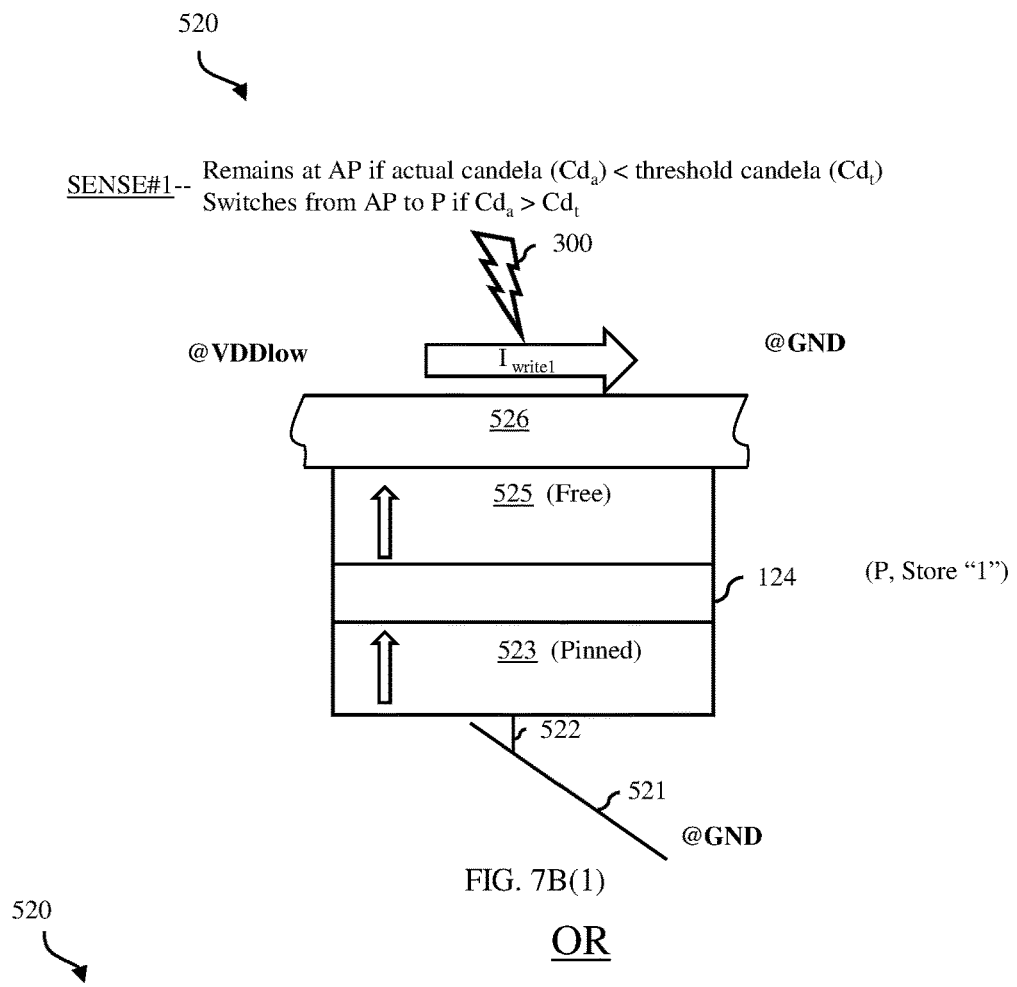
FIG. 7B(1)
OR
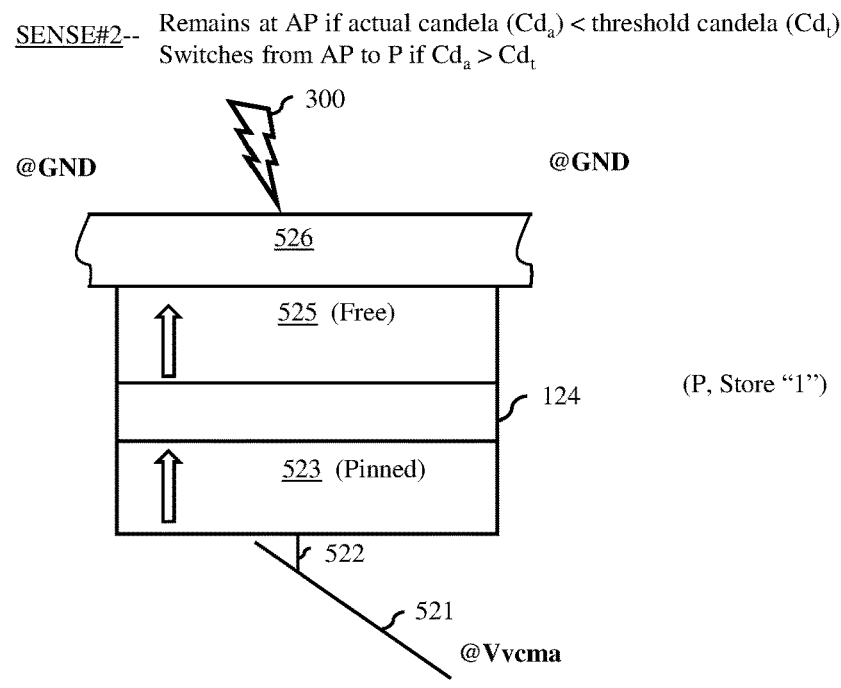
FIG. 7B(2)

IMAGE SENSOR INCORPORATING AN ARRAY OF OPTICALLY SWITCHABLE MAGNETIC TUNNEL JUNCTIONS

BACKGROUND

Field of the Invention

The present invention relates to sensors and, more particularly, to embodiments of an image sensor that incorporates an array of optically switchable magnetic tunnel junctions (MTJs).

Description of Related Art

Conventional image sensors are complementary metal oxide semiconductor (CMOS)-based. Specifically, they include an array of CMOS-based pixels. An exemplary CMOS-based pixel includes a photodiode (e.g., a PIN photodiode) and at least three transistors including a reset transistor (e.g., a p-type field effect transistor (PFET)), an amplifying transistor (e.g., an n-type field effect transistor (FFET), and an access or select transistor (e.g., another NFET). One disadvantage of such a CMOS-based image sensor is that the pixels are not radiation hardened. Specifically, radiation can cause leakage of stored data values. Another disadvantage is that due to the required number of devices per pixel (e.g., a photodiode and at least three transistors) and the relatively large size of photodiodes, an array of pixels consumes a large amount of chip area.

SUMMARY

Generally, disclosed herein are embodiments of an image sensor that includes an array of optically switchable magnetic tunnel junctions (MTJs) arranged in columns and rows. The MTJs can each include an insulator layer between a free layer and a pinned layer. The image sensor can further include first lines. The first lines can be made, at least in part, of a transparent conductive material. Each first line can traverse a corresponding row of MTJs such that it extends across and is in contact with the free layer of each MTJ in that corresponding row. The image sensor can further include second lines. The second lines can be made of a conductive material. Each second line can be electrically connected to the pinned layer of each MTJ in a corresponding column. The MTJs in such an image sensor can concurrently store image data in response to specific biasing conditions on the first lines and the second lines and concurrent exposure of the first lines to radiation.

For example, the image sensor embodiments disclosed herein can include peripheral circuitry connected to the first lines and the second lines and a controller in communication with the peripheral circuitry. In response to control signals from a controller, the peripheral circuitry can apply a first set of biasing conditions to the first lines and the second lines to perform a global reset operation with respect to the MTJs and, more particularly, to cause all the MTJs to concurrently store first data values (e.g., "0" data values). In response to different control signals from the controller, the peripheral circuitry can apply a second set of biasing conditions to the first lines and the second lines to perform a global sense operation and, more particularly, to perform an image capture operation causing the MTJs to capture and store image data. Specifically, the second biasing conditions can be applied by the peripheral circuitry to the first lines and the second lines, so that, in response to all of the first lines being concurrently exposed to radiation, switching of a first data value to a second data value only occurs in a given magnetic tunnel junction when an actual intensity level of the radiation received at an immediately adjacent first line portion is greater than a threshold intensity level. Finally, in response to still different control signals from the controller, the peripheral circuitry can apply a third set of biasing conditions to select first and second lines to enable a selective read operation to be performed and, more particularly, to enable the stored data values in a given MTJ to be read out.

It should be noted that different image sensor embodiments disclosed herein can include different types of MTJs.

For example, some of the image sensor embodiments disclosed herein can include an array of spin hall effect-type magnetic tunnel junctions (SHE-MTJs). Each SHE-MTJ can include an insulator layer between a free layer and a pinned layer. These image sensor embodiments can further include first lines. The first lines can comprise a transparent conductive spin hall effect material (e.g., a heavy metal or graphene with a thickness that is less than 3 nm or some other suitable transparent conductive material that exhibits the spin hall effect material). Each first line can traverse and be in contact with the free layer of each SHE-MTJ in a corresponding row. These image sensor embodiments can also include second lines. The second lines can comprise a conductive material. Each second line can be electrically connected to the fixed layer of each magnetic tunnel junction in a corresponding column.

Other image sensor embodiments disclosed herein can include an array of spin transfer torque-type magnetic tunnel junctions (STT-MTJs). Each STT-MTJ can include an insulator layer between a free layer and a pinned layer. These image sensor embodiments can further include first lines. The first lines can comprise a transparent conductive material (e.g., indium tin oxide or some other suitable transparent conductive material). Each first line can traverse and be in contact with the free layer of each STT-MTJ in a corresponding row. These image sensor embodiments can also include second lines. The second lines can comprise a conductive material. Each second line can be electrically connected to the fixed layer of each magnetic tunnel junction in a corresponding column.

Depending upon the type of MTJ used in the MTJ array of the image sensor (e.g., SHE-MTJs or STT-MTJs), the biasing conditions applied to the first lines and the second lines during the global reset, global sense and selective read operations, mentioned above, will vary (as discussed further in the detailed description section).

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1A:
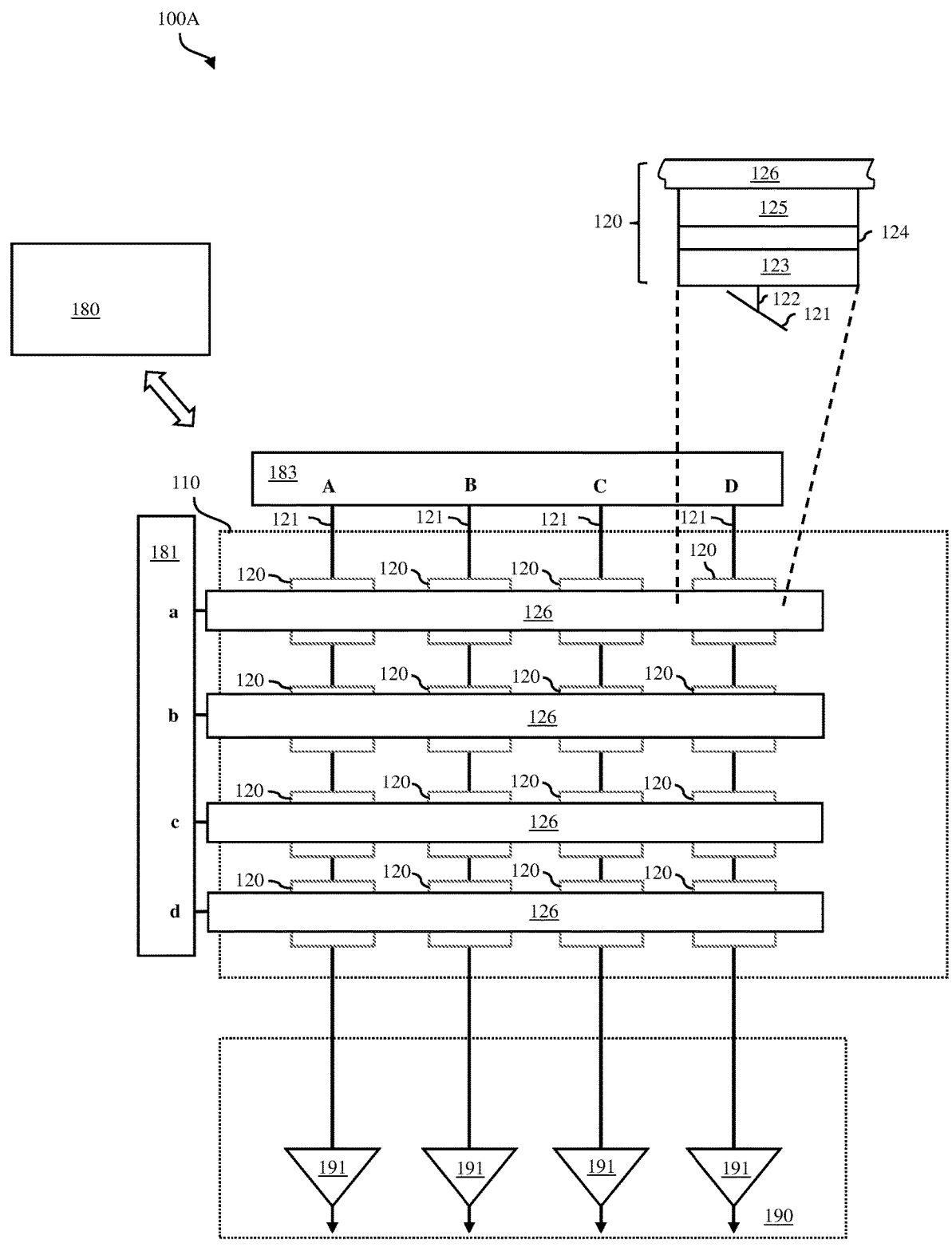
FIGS. 1A, 1B, and 1C are schematic drawings illustrating image sensor embodiments, respectively, each including optically switchable spin transfer torque-type (STT) magnetic tunnel junctions (MTJs)

As mentioned above, conventional image sensors are complementary metal oxide semiconductor (CMOS)-based. Specifically, they include an array of CMOS-based pixels.

An exemplary CMOS-based pixel includes a photodiode (e.g., a PIN photodiode) and at least three transistors including a reset transistor (e.g., a p-type field effect transistor (PFET)), an amplifying transistor (e.g., an n-type field effect transistor (NFET)), and an access or select transistor (e.g., another NFET). In such a pixel, the reset transistor and the photodiode are electrically connected in series between a positive voltage rail and a ground rail. A sense node is located at the junction between the photodiode and the reset transistor. The amplifying transistor and the access transistor are electrically connected in series between another positive voltage rail and a bitline. The gate of the reset transistor is controlled by a reset signal (RST). The gate of the amplifying transistor is electrically connected to the sense node and the gate of the access transistor is electrically connected to a wordline. Within the array, all of the pixels in the same column are electrically connected to the same bitline and all pixels in the same row are electrically connected to the same wordline.

Image sensor operation proceeds as follows. During a pre-charge operation, RST is switched to a logic "0" in order to turn on the reset transistors of each pixel and, thereby pre-charge the sense nodes. During a sense operation (also referred to as an image capture operation), RST is switched to a logic "1" to turn off the reset transistors of each pixel and the photodiodes are exposed to light. In each pixel, depending upon the intensity level of the light received at the photodiode of the pixel, the voltage level on the sense node of the pixel will either stay at the same pre-charged voltage level so that the amplifying transistor remains in an on-state or will be discharged to a lower voltage level so that the amplifying transistor switches to an off-state. In other words, a sensed data value will be generated on the sense node of the pixel. During a read operation, to read the stored data value from a selected pixel, the wordline for the row containing the selected pixel will be switched to the high voltage level, thereby turning on the access transistor, and any change in the voltage level (or alternatively the current level) on the bitline for the column that contains the selected pixel can be sensed (e.g., by a sense amplifier, transimpedance amplifier (TIA) or the like) and can indicate the stored data value.

One disadvantage of such a CMOS-based image sensor is that the pixels are not radiation hardened. Specifically, radiation can cause leakage of the stored data values. Thus, it is imperative that that the stored data values are quickly read from the pixels and stored in memory before such leakage occurs to avoid errors. Another disadvantage is that due to the required number of devices per pixel (e.g., a photodiode and at least three transistors) and the relatively large size of photodiodes, an array of pixels consumes a large amount of chip area.

Generally, disclosed herein are various embodiments of an image sensor that includes an array of optically switchable magnetic tunnel junctions (MTJs) arranged in columns and rows. Each MTJ can be a back-end-of-the-line (BEOL) multi-layer structure that includes an insulator layer between a free layer at a first side and a pinned layer at a second side. Each image sensor embodiment can further include first lines. The first lines can comprise a transparent conductive material and can be immediately adjacent to the rows of MTJs, respectively. Specifically, each first line can traverse a corresponding row of MTJs such that it extends across and is in contact with the free layer of each MTJ in that corresponding row. Each image sensor embodiment can further include second lines. The second lines can comprise a conductive material and can be electrically connected to the columns of MTJs, respectively. Specifically, each second line can be electrically connected to the pinned layer of each MTJ in a corresponding column. Additionally, each image sensor embodiment can be configured so that the first lines are concurrently exposable to radiation and so that both the first lines and the second lines are selectively biasable to enable performance of global reset, global sense and selective read operations with respect to the MTJs in the array without the need for transistors (e.g., access transistors, etc.) for each MTJ.

For purposes of this disclosure, a global reset operation refers to an operation wherein all of the MTJs in the array are reset to the same state (e.g., an anti-parallel state) such that they store the same data value (e.g., a "0"). A global sense operation (also referred to herein as an image capture operation) refers to an operation wherein all the first lines are exposed to radiation and, depending upon the intensity level of the radiation, in the portions of the first lines immediately adjacent to the MTJs some of the MTJs may switch states (e.g., from the AP state to a parallel (P) state) such that they now store a different data value (e.g., a "1"). The data values stored in all of the MTJs following a global sense operation is referred to herein as the image data values. Thus, the MTJs are considered to be optically switchable. A selective read operation refers to an operation wherein a value of a selected pixel, which is either a single-MTJ pixel or a multi-MTJ pixel (depending upon the embodiment, as discussed below) and which corresponds to a given location of an image captured during the global sense operation, is read out (i.e., sensed, determined, etc.). As discussed below with regard to the various different embodiments, biasing of the first lines and the second lines during the different global reset, global sense, and selective read operations will vary depending upon the type of MTJs used in the array (e.g., spin transfer torque-type (STT) MTJs or spin hall effect-type (SHE) MTJs).

Figure 1B:
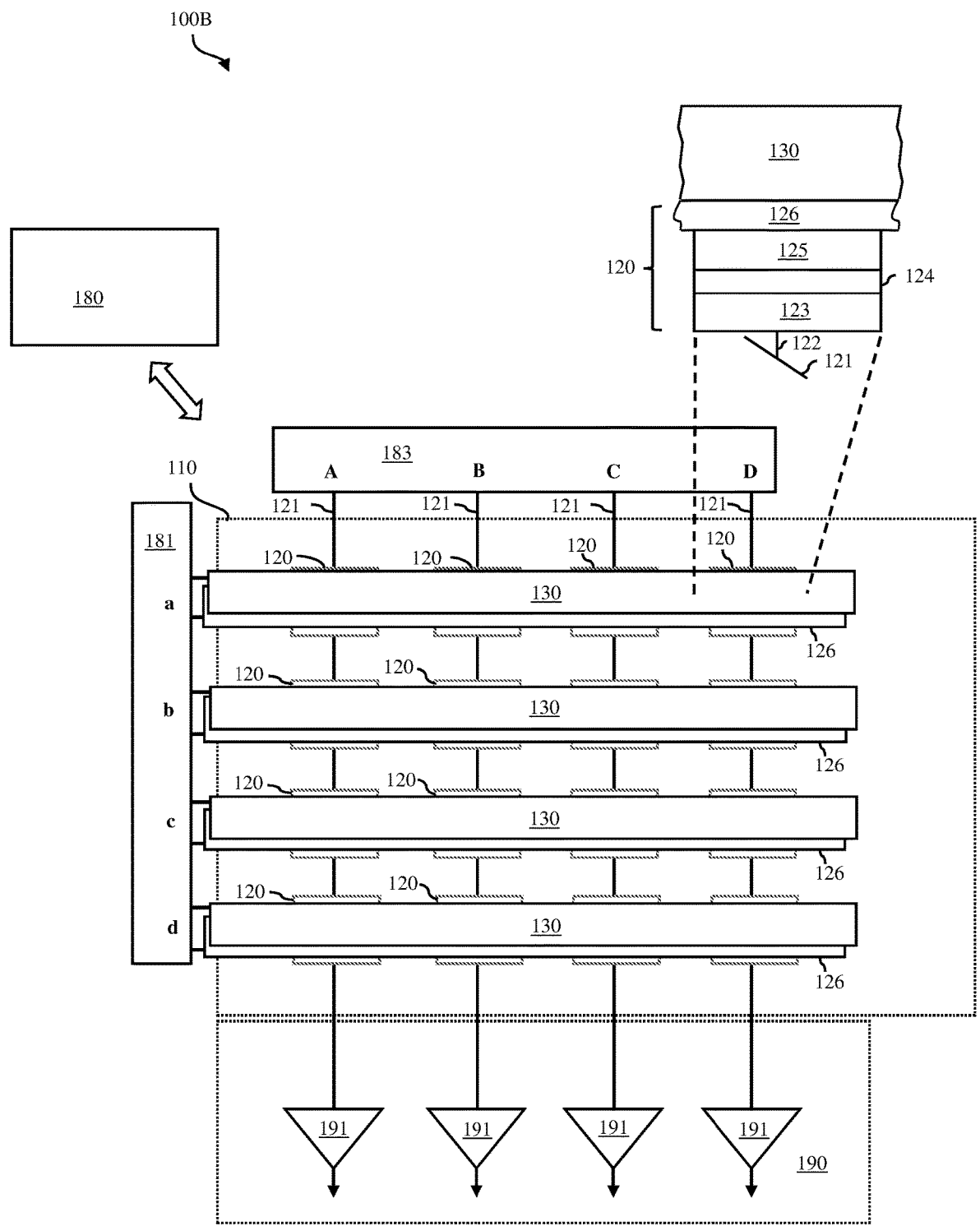
Figure 1C:
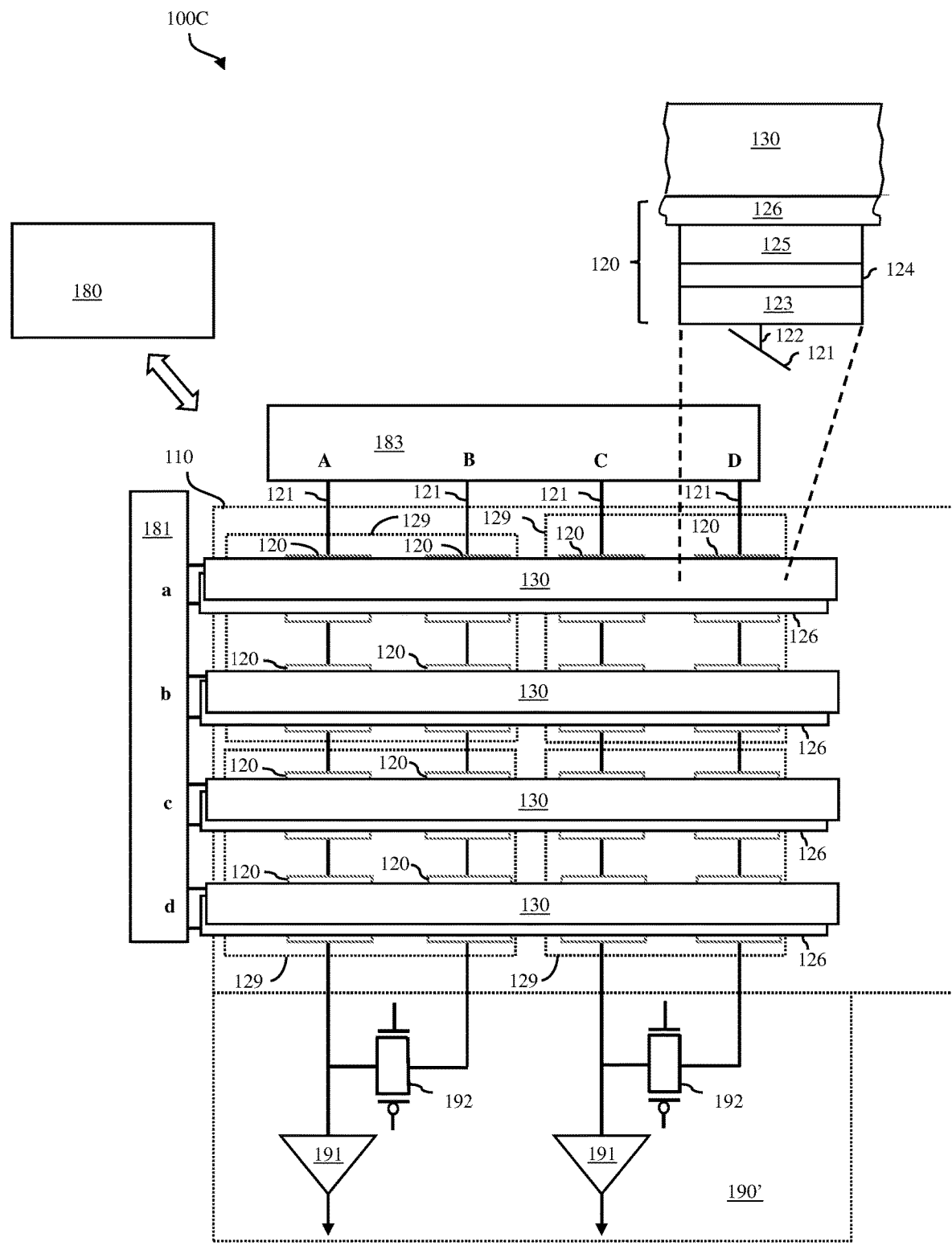

More specifically, referring to FIGS. 1A, 1B, and 1C, some image sensor embodiments 100A, 100B and 100C disclosed herein include an array 110 of optically switchable magnetic tunnel junctions (MTJs) and, particularly, optically switchable spin transfer torque-type (STT) MTJs 120 that are arranged in columns and rows. For purposes of illustration, the array 110 is shown to have four columns A-D and four rows a-d. However, it should be understood that the figures are not intended to be limiting and that, alternatively, the array 110 could have any number of two or more columns and two or more rows of STT-MTJs 120.

Each of the STT-MTJs 120 can be a back-end-of-the-line (BEOL) multi-layer structure. That is, each STT-MTJs 120 can be a multi-layer structure formed in the BEOL metal levels above the front-end-of-the-line (FEOL) devices (e.g., semiconductor devices, etc.) on an integrated circuit chip. Each STT-MTJ 120 can include an insulator layer 124 (also referred to as a tunneling barrier layer) between a free ferromagnetic layer 125 (also referred to herein as a free layer or a data store layer) at a first side and a pinned ferromagnetic layer 123 (also referred to herein as a pinned layer or a fixed ferromagnetic layer) at a second side. In one exemplary embodiment, the pinned ferromagnetic layer 123 can be, for example, a gadolinium (Gd), iron (Fe), and cobalt (Co) alloy layer. The insulator layer 124 (i.e., the tunneling barrier layer) can be, for example, any of a magnesium oxide (MgO) layer, an aluminum oxide ($Al_2O_3$) layer (also referred to as alumina) and a bismuth ferrite ($BiFeO_3$, also referred to as BFO) layer. The free ferromagnetic layer 125 can be, for example, a cobalt (Co), iron (Fe), boron (B) alloy layer.

Figure 2A:
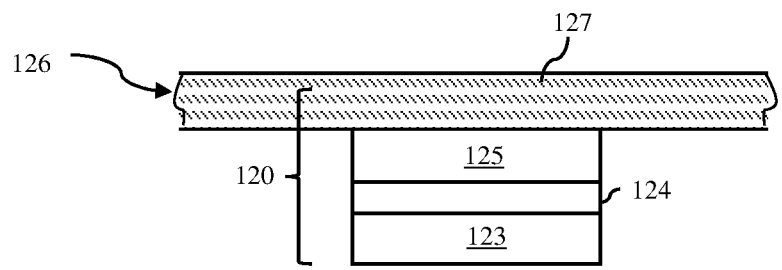
FIGS. 2A, 2B and 2C are cross-section drawings illustrating different configurations, respectively, for the first lines employed above the STT-MTJs in any of the image sensor embodiments of shown in FIGS. 1A, 1B and 1C.
Figure 2B:
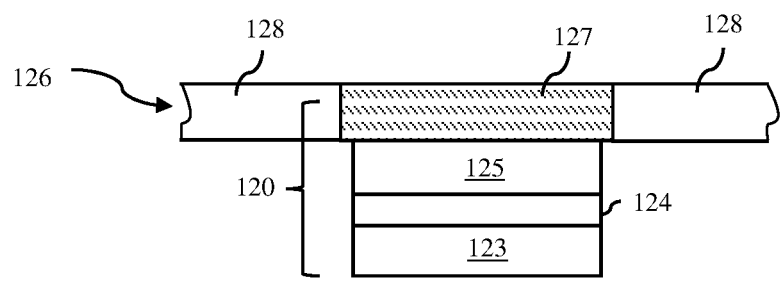
Figure 2C:
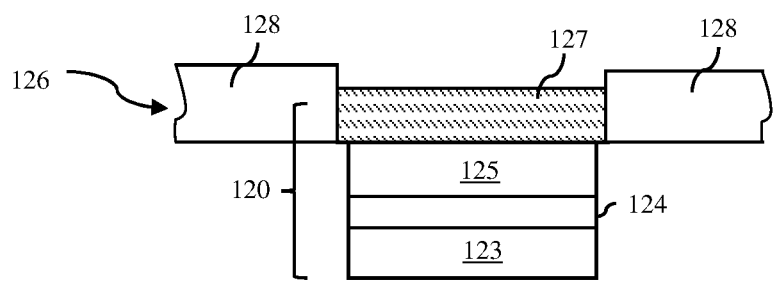

These image sensor embodiments 100A, 100B, and 100C can further include first lines 126. The first lines 126 can be immediately adjacent to the rows a-d of STT-MTJs 120, respectively. Specifically, each first line 126 can traverse a corresponding row of STT-MTJs such that it extends across and is in contact with the free layer 125 of each STT-MTJ 120 in that corresponding row. The first lines 126 can be, for example, relatively thin and flat strips of material (also referred to as nanosheets) that are: (a) made up entirely of transparent conductive material 127 (as shown in FIG. 2A) or (b) that have first sections, which are immediately adjacent to the free layers 125 of the STT-MTJs 120 and which are made of the transparent conductive material 127, and second sections, which are on opposing sides of the first sections (e.g., such that each first section is positioned laterally between two second sections) and which are made up of a metal or metal alloy material 128 for increased conductivity (as shown in FIG. 2B or 2C). In any case, the transparent conductive material 127 can include, for example, indium tin oxide (ITO), zinc oxide (ZnO), graphene or any other suitable transparent conductive material. In the case where the first lines 126 have first sections of transparent conductive material 127 and second sections of a metal or metal alloy material 128, the metal or metal alloy material 128 can be, for example, copper, aluminum, or any other suitable BEOL metal or metal alloy material. Additionally, the first sections of the transparent conductive material 127 and the second sections of the metal or metal alloy material 128 may have the same thicknesses (as shown in FIG. 2B) or different thicknesses (e.g., the second sections of the metal or metal alloy material 128 can be thicker than the first sections of the transparent conductive material 127) (as shown in FIG. 2C).

These image sensor embodiments 100A, 100B, and 100C can further include second lines 121 of conductive material. The second lines 121 can be, for example, wires made of a metal or metal alloy (e.g., copper or any other suitable BEOL metal or metal alloy). The second lines 121 can be electrically connected (e.g., by local interconnects 122) to the MTJs in the columns A-D of STT-MTJs, respectively. Specifically, each second line 121 can be electrically connected by a local interconnect 122 to the pinned layer 123 of each STT-MTJ 120 in a corresponding column A-D.

Additionally, these image sensor embodiments 100A, 100B, and 100C can be configured so that both the first lines and the second lines are selectively biasable so as to enable performance of global reset, global sense and selective read operations with respect to the STT-MTJs without the need for transistors (e.g., access transistors, etc.) for each STT-MTJ.

Specifically, the image sensor embodiments 100A, 100B, and 100C can further include a controller 180 and peripheral circuitry 181 and 183. In response to control signals from the controller 180, the peripheral circuitry 181 and 183 can cause specific biasing of the first lines 126 and second lines 121, during global reset, global sense and selective read operations, as discussed below. Specifically, peripheral circuitry 181 can be connected to the first lines 126 for the rows and can include, for example, address decode logic and first line drivers for appropriately biasing the first lines as discussed below. Peripheral circuitry 183 can be connected to the second lines 121 for the columns and can include column address decode logic and second line drivers for appropriately biasing the second lines as discussed below. Peripheral circuitry configured to selectively bias lines of an array in response to control signals from a controller are well known in the art. Thus, the details thereof have been omitted from this specification in order to allow the reader to focus on the salient aspects of the disclosed embodiments.

These image sensor embodiments 100A, 100B, and 100C can further be configured so that the first lines 126 are concurrently exposable to radiation (e.g., ambient radiation of different wavelengths) at least during the global sense operations. For example, the first lines 126 can be continuously exposed to ambient light either because the top surfaces of the first lines 126 are devoid of any other films or because the top surfaces of the first lines 126 are only covered by transparent films (as in the image sensor embodiment 100A of FIG. 1A). Alternatively, a single on-demand radiation shield can cover the entire array 110 (not illustrated) or multiple discrete on-demand radiation shields 130 can be aligned above the first lines 126, respectively (as in the image sensor embodiments 100B of FIG. 1B and 100C of FIG. 1C). Such on-demand radiation shields can be configured to switch between opaque and transparent states in response to different biasing conditions (e.g., as applied by peripheral circuitry 181 in response to control signals from the controller 180) such that exposure of the first lines only occurs when needed (e.g., during the global sense operations). That is, in a first state under a first set of biasing conditions, the on-demand radiation shield(s) can be essentially opaque preventing transmission of radiation to the first lines 526, whereas, in a second state under a second set of biasing conditions that is different from the first set, the on-demand radiation shield(s) can be essentially transparent allowing concurrent exposure of the first lines 126 to radiation.

Figure 3:
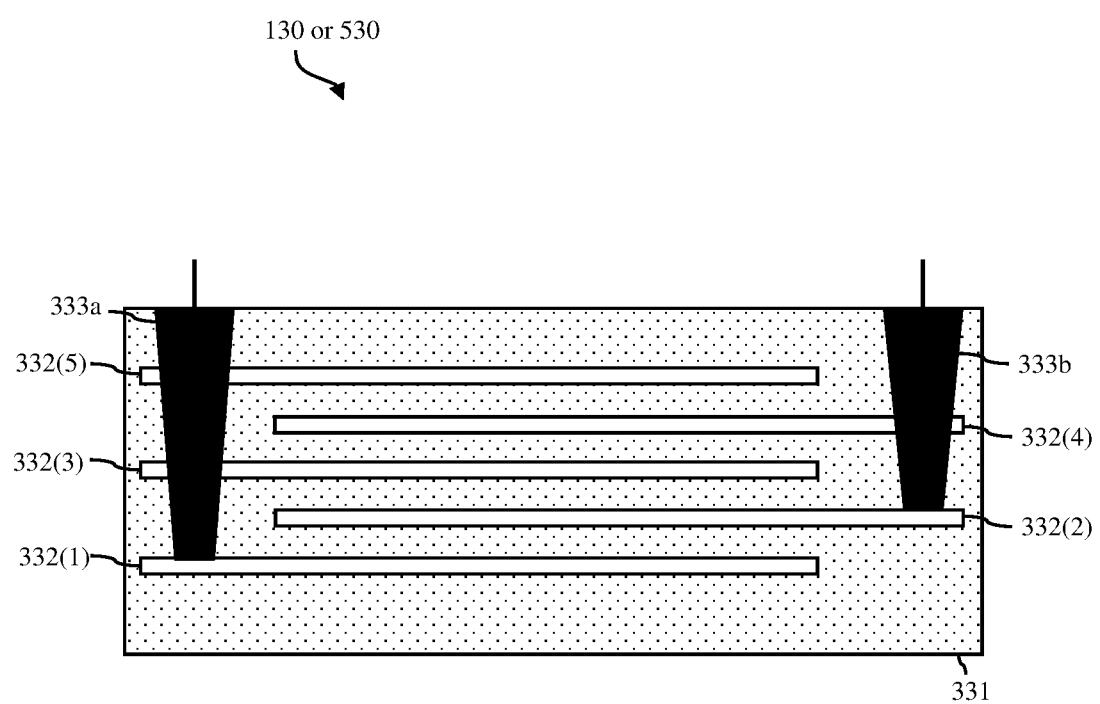
FIG. 3 is a cross-section diagram illustrating an exemplary on-demand radiation shield that can be incorporated into the image sensor embodiments shown in FIGS. 1B and 1C.

FIG. 3 is a cross-section diagram illustrating an exemplary on-demand radiation shield. This on-demand radiation shield includes multiple stacked, relatively, thin layers (e.g., layers that are less than 3 nm each) of indium tin oxide (ITO) 332(1)-332(5). For purposes of illustration, five ITO layers are shown in FIG. 3; however, alternatively, a different number of multi ITO layers could be used (e.g., three or more). In any case, the ITO layers 332(1)-332(5) embedded within cladding material such that the ITO layers are separated by the cladding material 331. Alternating ones of the ITOs layers are electrically connected to each other. For example, odd numbered ITO layers 332(1), (3) and (5) can be electrically connected to each other via a contact 333a at one end and even numbered ITO layers 332(2) and (4) can be electrically connected to each other via a different contact 333b at the opposite end. Depending upon the voltage applied to the odd ITO layers and the even ITO layers through the contacts 333a and 333b, respectively, this radiation shield 130 will be either transparent to radiation (e.g., a given wavelength range) or opaque. For example, if one set of the ITO layers (e.g., the odd ITO layers) are negatively biased (e.g., −3 V) and the other set of ITO layers (e.g., the even ITO layers) are connected to ground, the radiation shield 130 may have a relatively low refractive index (e.g., n~1, such as n=1.042) and high extinction coefficient (e.g., k>0.2, such as k=0.273) such that it behaves as a Bragg reflector and results in a high transmission loss (e.g., of −40 dB or more, such as −47 dB) and, is thereby essentially opaque. Contrarily, if the ITO layers are unbiased, the radiation shield 130 may have a relatively high refractive index (e.g., n~2, such as n=1.964) and low extinction coefficient (e.g., k>0.005, such as k=0.002) such that it results in a low transmission loss (e.g., of −4 dB or less, such as −3 dB) and, is thereby essentially transparent.

Figure 4A:
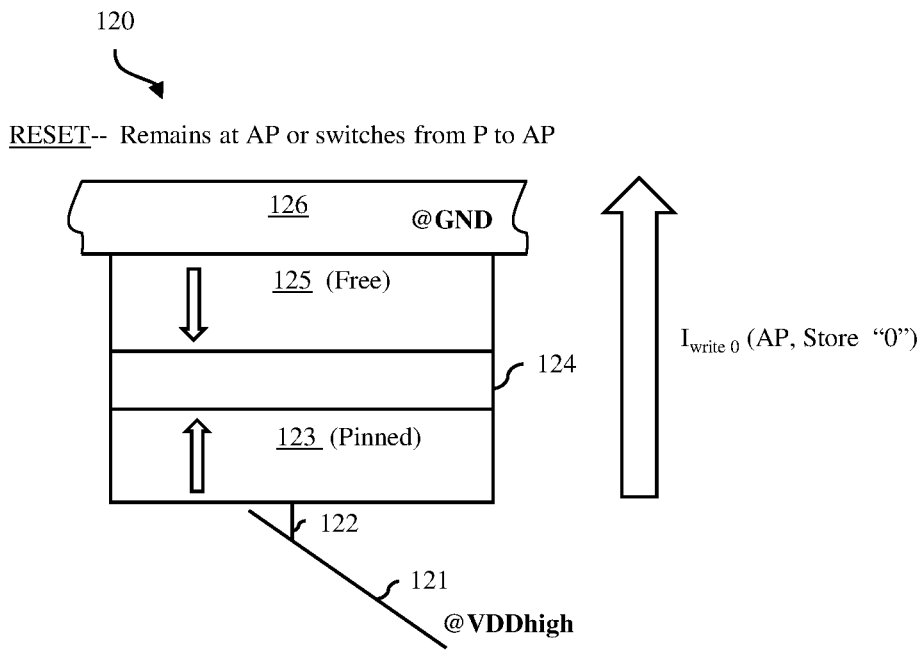
FIGS. 4A, 4B and 4C illustrate an exemplary STT-MTJ in any of the image sensor embodiments of FIGS. 1A, 1B and 1C during reset, sense and read operations, respectively.

FIG. 4A is a cross-section diagram illustrating an exemplary STT-MTJ 120 during a global reset operation. During the global reset operation, all of the first lines 126 can be discharged to ground and a first positive voltage (e.g., VDD high) can be applied to all of the second lines 121 so that sufficiently high currents flow in a first direction from the second lines 121 through each of the STT-MTJs 120 (i.e., through the pinned layer 123, the tunneling barrier layer 124 and the free layer 125), thereby causing all the STT-MTJs 120 in the array 110 to be concurrently reset to the anti-parallel (AP) state. Thus, as a result of the global reset operation, the same first data value (e.g., a "0") is concurrently stored in each of the STT-MTJs 120 in the array 110.

Figure 4B:
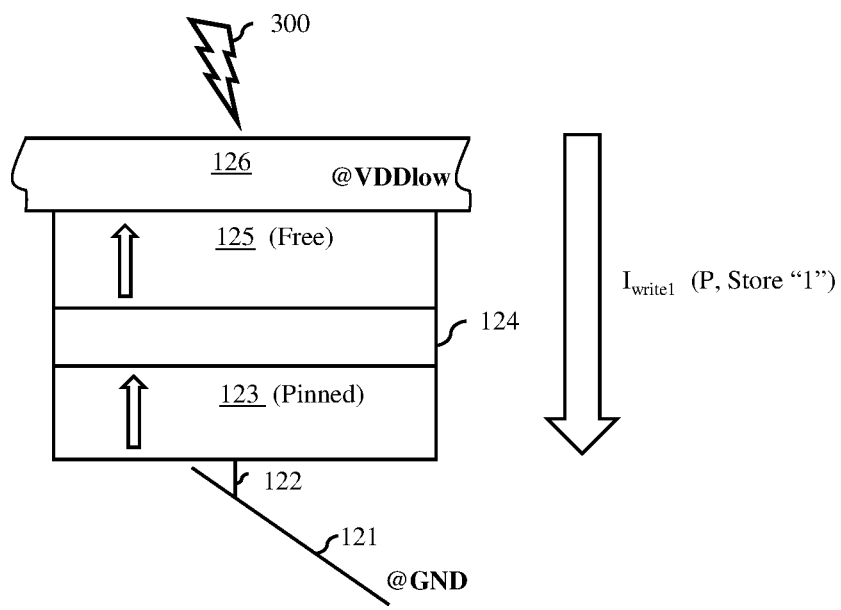

FIG. 4B is a cross-section diagram illustrating an exemplary STT-MTJ 120 during a global sense operation. During the global sense operation (also referred to herein as an image capture operation), a second positive voltage (e.g., VDD low) that is less than the first positive voltage (e.g., VDD high) can be applied to all the first lines 126 and all the second lines 121 can be discharged to ground. Under these biasing conditions, low currents flow in a second direction from the first lines 126 through each of the STT-MTJs 120 (i.e., through the free layer 125, the tunneling barrier layer 124, and the pinned layer 123) to the second lines 121. However, switching of any given STT-MTJ 120 from the AP state to the parallel (P) state so that the stored data value is switched from the first data value (e.g., a "0") to a second data value (e.g., a "1") will only occur when the actual luminous intensity level of radiation 300 received at an immediately adjacent first line portion is greater than a threshold luminous intensity level (i.e., actual candela ($Cd_a$) >threshold candela ($Cd_t$)). That is, during the global sense operation, all the first lines 126 will be concurrently exposed to radiation either because: (a) the top surfaces of the first lines 126 are continuously exposed regardless of the operation (e.g., as in the image sensor 100A) or (b) because the state of the on-demand radiation shield(s) 130 have been switched, on demand as discussed above, to allow transmission of radiation (e.g., as in the image sensor 100B or 100C). Depending upon the particular image being captured during this global sense operation, the actual luminous intensity level of the radiation 300 received in any given area of the first lines 126 above any given STT-MTJ may vary. If the actual luminous intensity level of radiation 300 received at a specific first line portion, which is above and immediately adjacent to a specific STT-MTJ, is less than a threshold luminous intensity level, then the combined energy from the applied bias on the first lines 126 and the radiation 300 received at the specific first line portion will not be sufficient to cause the specific STT-MTJ immediately adjacent thereto to switch from the AP state to the P state. That is, the specific STT-MTJ will continue to store the first data value (e.g., a "0"). However, if the actual luminous intensity level of radiation 300 received at a specific first line portion, which is above and immediately adjacent to a specific STT-MTJ, is greater than a threshold luminous intensity level, then the combined energy from the applied bias on the first lines 126 and the radiation 300 received at the specific first line portion will cause the specific STT-MTJ to switch from the AP state to the P state. That is, the stored data value in the specific STT-MTJ will switch from the first data value (e.g., a "0") to the second data value (e.g., a "1"). Thus, the STT-MTJs 120 in the array 110 are considered to be optically switchable during this global sense operation.

Optionally, the materials of the STT-MTJs and/or the biasing conditions employed during the global sense operation can be specifically selected so that the radiation-induced switching only occurs in response to radiation that is both over the threshold intensity value and within a specific range of wavelengths.

Figure 4C:
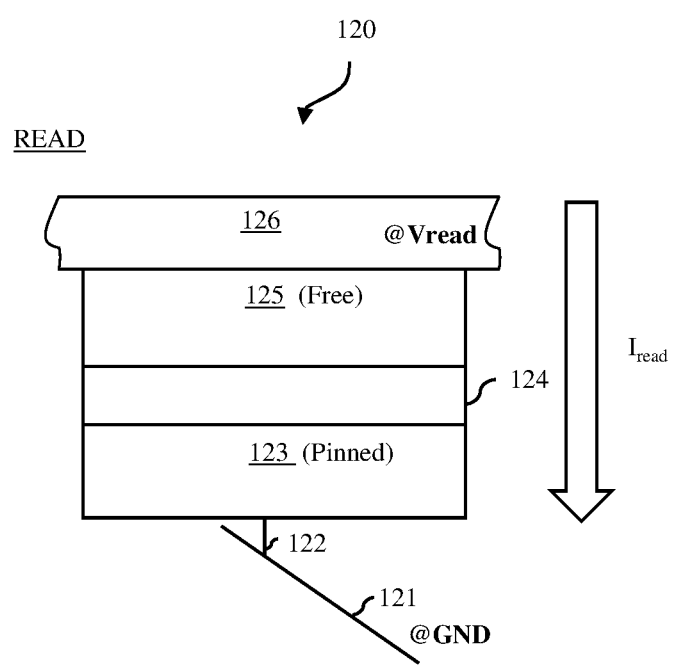

Selective read operations can subsequently be performed to read out pixel values corresponding to different locations of the image captured during the global sense operation. FIG. 4C is a cross-section diagram illustrating an exemplary STT-MTJ 120 during a selective read operation.

In some image sensor embodiments (e.g., see the image sensor embodiments 100A of FIG. 1A and 100B of FIG. 1B), the pixels can be single-MTJ pixels such that, within the array 110, the number of columns of pixels and the number of rows of pixels are the same as the number of columns of STT-MTJs and the number of rows of STT-MTJs. In this case, the image sensors can include a sense circuit 190 and this sense circuit 190 can include amplifiers 191 (e.g., sense amplifiers, operational amplifiers (OPAMP) or any other suitable type of amplifiers) electrically connected to the second lines 121, respectively. It should be noted that the ground connection to the second lines 121 could also be made through virtual ground connections using off-set compensated OPAMPs. During a selective read operation of a selected single-MTJ pixel (which in this case is a read operation of the single STT-MTJ therein), a read voltage (Vread) can be applied to the specific first line 126 that is in contact with the STT-MTJ of the selected single-MJT pixel (i.e., the specific first line 126 for the row that contains the STT-MTJ of the selected single-MJT pixel). Vread can be less than the voltage level required to switch the STT-MTJ of the selected single-MTJ pixel from the AP state to the P state in the presence of radiation (as in the image sensor 100A) or, alternatively, in the absence of radiation when an on-demand radiation shield 130 is opaque (as in the image sensor 100B). All other first lines can be discharged to ground. As a result of these biasing conditions, the output of the specific amplifier 191 for the specific column that contains the STT-MTJ of the selected single-MTJ pixel (i.e., the output of the specific amplifier 191 on the specific second line 121 that is electrically connected the STT-MTJ of the selected single-MTJ pixel) will be indicative of the pixel value.

It should be noted that, optionally, the STT-MTJs can be engineered to be high resistance devices (for example, by increasing the thickness of the insulator layer 124) to suppress the effects of sneak currents from unselected rows during the selective read operation. It should also be noted that, given the above-mentioned biasing conditions, concurrent read operations of the pixel values read as the stored data values of all single STT-MTJs of all single-MJT pixels in a given row of pixels can be performed.

Alternatively, in other image sensor embodiments (e.g., see the image sensor embodiment 100C of FIG. 1C), the pixels can be multi-MTJ pixels. That is, each pixel corresponding to a given location of the image captured during the global sense operation can be associated with multiple STT-MTJs 120. For example, each multi-MTJ pixel 129 corresponding to a given location of the image captured during the global sense operation can be associated with two or more adjacent STT-MTJs 120 from two or more adjacent columns and/or two or more adjacent STT-MTJs 120 from two or more adjacent rows. For purposes of illustration, in FIG. 1C, each multi-MTJ pixel 129 is associated with four STT-MTJs include two from adjacent columns of STT-MTJs and two from adjacent rows of STT-MTJs. Thus, the exemplary array 110 that has four columns A-D of STT-MTJs and four rows a-d of STT-MTJs, will have only two columns of pixels and two rows of pixels. In this case, the sense circuit 190' can include switches 192 (e.g., transmission gates) between adjacent second lines in the sets of second lines that associated with each of the columns of pixels, respectively. That is, each pair of adjacent second lines in a given set of second lines that is associated with a given column of pixels will be electrically connectable (on-demand) through the use of a switch 192 (e.g., a transmission gate). The sense circuit 190' can further include amplifiers 191 (e.g., sense amplifiers or amplifiers of any other suitable type) that are electrically connected to the sets of the second lines, respectively. That is, each amplifier 191 can be electrically connected to a given set of second lines that is associated with a given column of pixels. During a selective read operation of a selected multi-MTJ pixel 129 (which in this case is a read operation of the combined value of the stored data values in four adjacent STT-MTJs), the switches 192 will turn on in response to one or more control signals (e.g., in response to an enable signal and an inverted enable signal) from the controller 180, thereby electrically connecting the adjacent second lines within each given set of second lines associated with each given column of pixels. Then, a read voltage (Vread) can be applied to only those first lines 126 that are in contact with the STT-MTJs of the selected multi-MTJ pixel 129. Vread can be less than the voltage level required to switch any of the STT-MTJs in the selected pixel 129 from the AP state to the P state in the presence of radiation (e.g., when no radiation shield is present (not shown)) or, alternatively, in the absence of radiation when an on-demand radiation shield 130 is opaque (as in the image sensor 100C). All other first lines can be discharged to ground. As a result of turning on the switches 192 and further as a result of the biasing conditions, the output of the specific amplifier 191 for the specific column of pixels that contains the selected multi-MTJ pixel 129 will be indicative of a combined value of the stored data values of all of the STT-MTJs in the selected multi-MTJ pixel 129.

By considering the results of the switching behavior of all STT-MTJs in a multi-MTJ pixel in response to exposure to radiation during a global sense operation instead of the switching behavior of only a single STT-MTJ in a single-MTJ pixel, image capture accuracy can be statistically improved. That is, instead of associating a given location of a captured image with high intensity light when the STT-MTJ of a single-MTJ pixel switches a stored data value in response to exposure to radiation during a global sense operation, accuracy is improved by associating the given location with high intensity light only when at least half of a group of adjacent STT-MTJs of a multi-MJT pixel switch their stored data values. In the former case, if the STT-MJT of the single-MJT pixel switches its' stored data value in error, then the value associated with the pixel will be wrong. In the latter case, if only one of the STT-MJTs of the multi-MJT pixel switches its' stored data value in error, the value associated with the pixel will still be correct. It should be noted that, given the above-mentioned biasing conditions, concurrent read operations of the pixel values from multi-MJT pixels in a given row of pixels can be performed. In any case, during selective read operations, the values read out from a single-MTJ pixel or a multi-MTJ pixel will be binary indicating either the presence or absence of a high intensity light (optionally of a particular color).

Optionally, with regard to multi-MJT pixels, the different STT-MTJs within a given group (i.e., within a multi-MTJ pixel) can be configured so as to have different energy-barriers. For example, the STT-MTJs within each multi-MTJ pixel could have different cross-section areas, respectively. In this case, an analog intensity of incident radiation can be sensed by probing the overall number of STT-MTJs within a group that switched during the global sense operation.

Figure 5A:
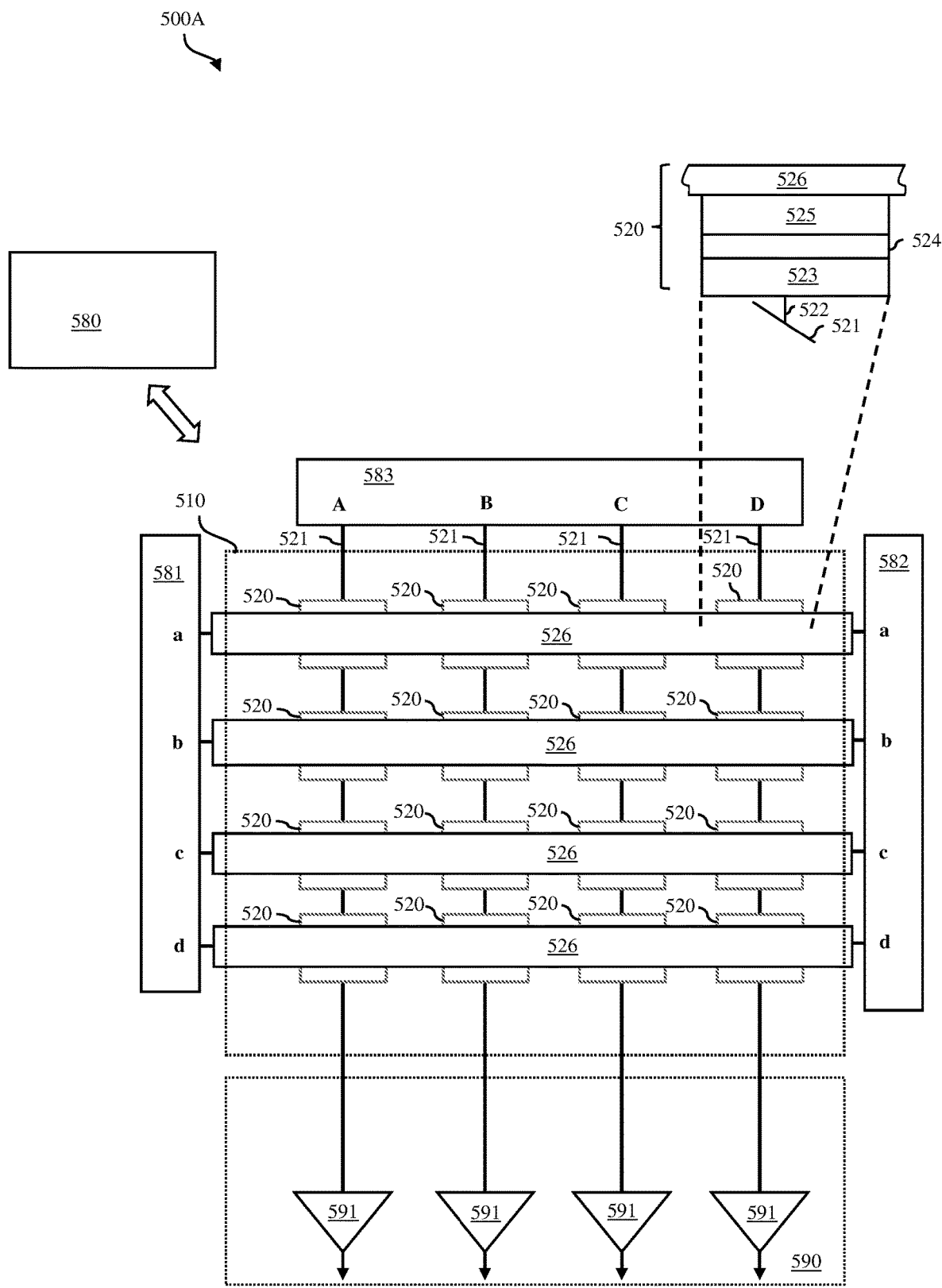
FIGS. 5A, 5B, and 5C are schematic drawings illustrating image sensor embodiments, respectively, each including optically spin hall effect-type (SHE) MTJs.
Figure 5B:
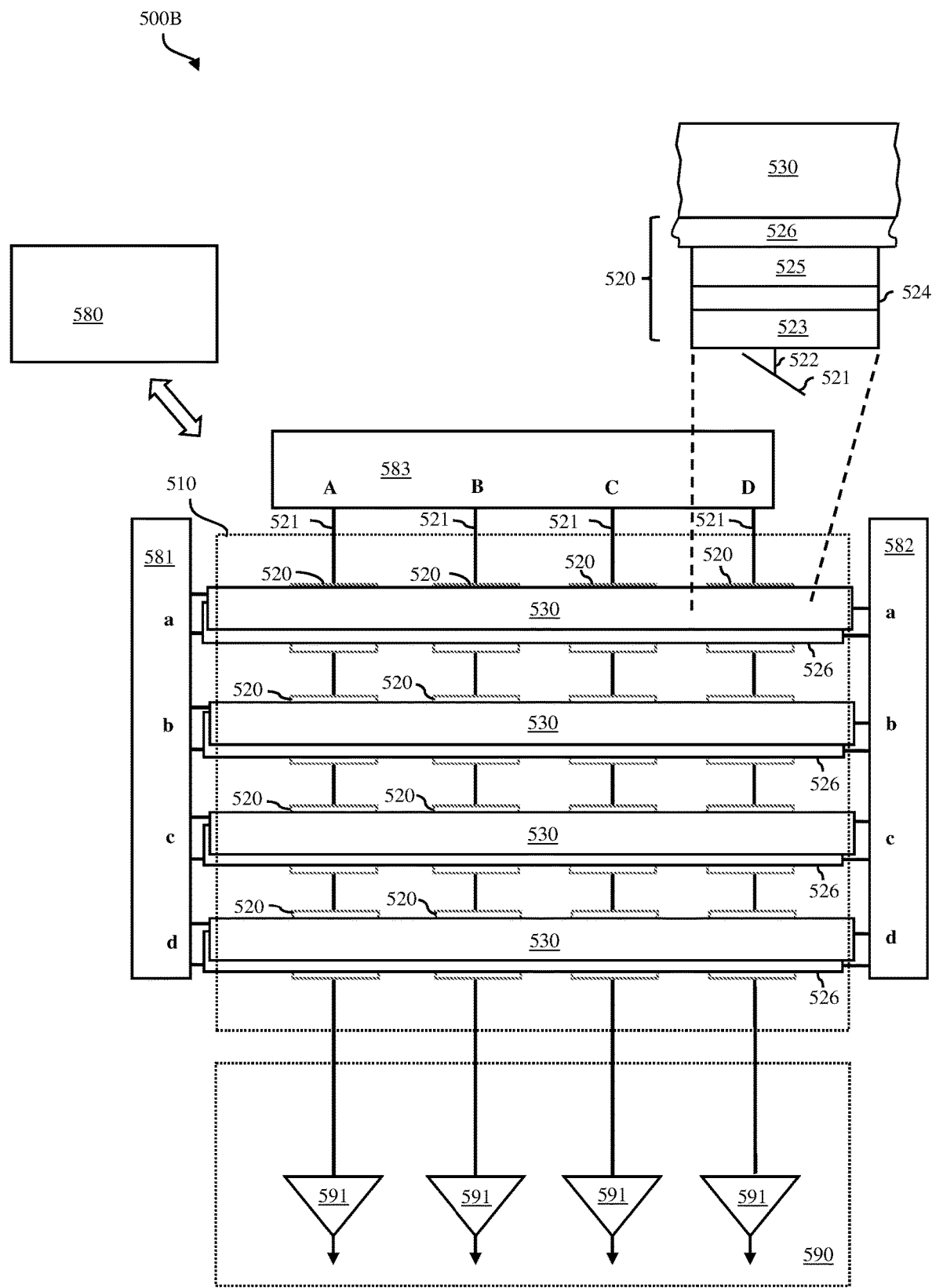
Figure 5C:
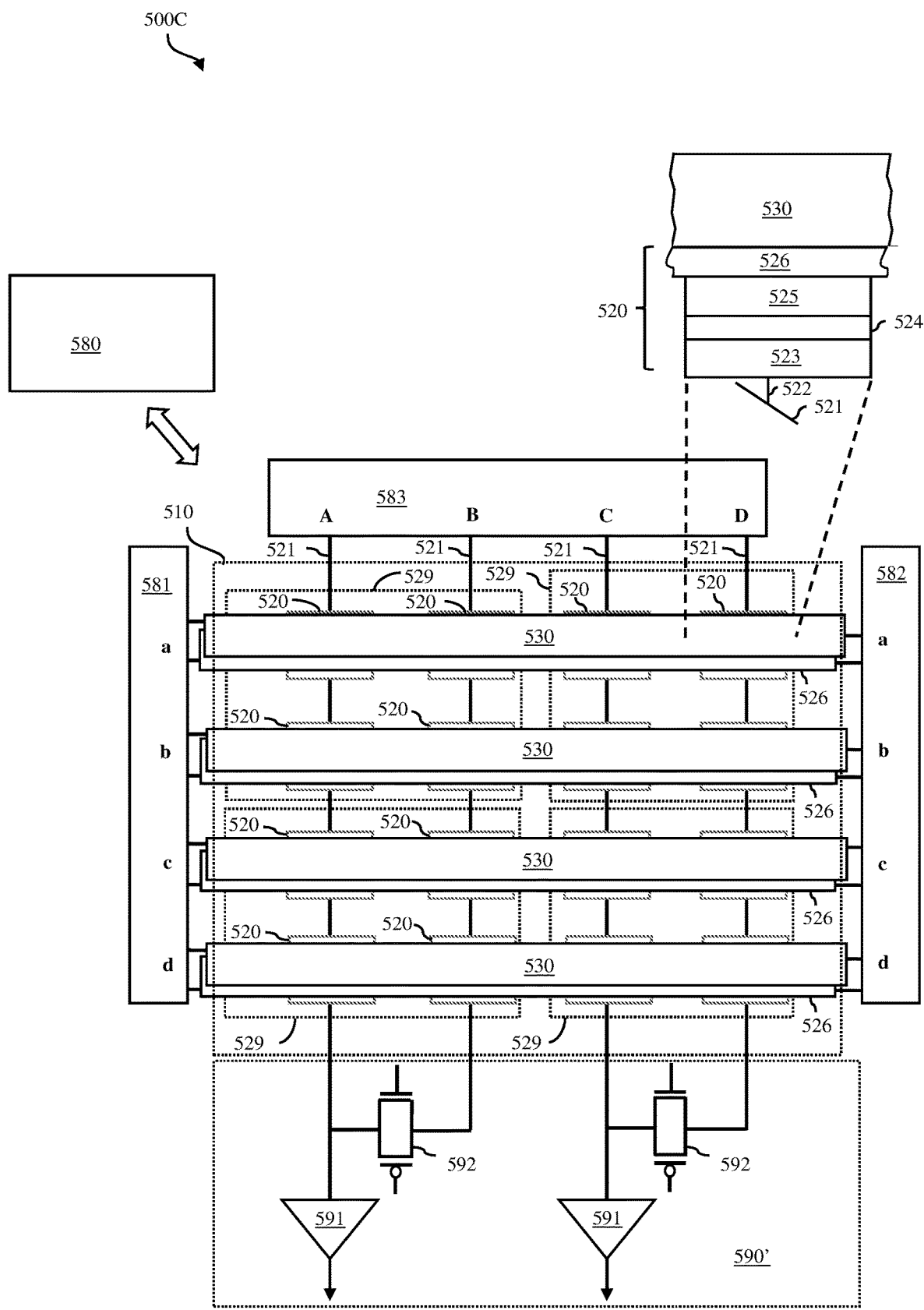

Referring to FIGS. 5A, 5B, and 5C, other image sensor embodiments 500A, 500B and 500C disclosed herein include an array 510 of optically switchable magnetic tunnel junctions (MTJs) and, particularly, optically switchable spin hall effect-type (SHE) MTJs 520 that are arranged in columns and rows. For purposes of illustration, the array 510 is shown to have four columns A-D and four rows a-d. However, it should be understood that the figures are not intended to be limiting and that, alternatively, the array 510 could have any number of two or more columns and two or more rows of SHE-MTJs 520. As discussed in greater detail below, the SHE-MTJs 520 may be conventional SHE-MTJs or voltage-controlled magnetic anisotropy (VCMA)-assisted SHE-MTJs.

In any case, each of the SHE-MTJs 520 can be a back-end-of-the-line (BEOL) multi-layer structure. That is, each SHE-MTJs 520 can be a multi-layer structure formed in the BEOL metal levels above the front-end-of-the-line (FEOL) devices (e.g., semiconductor devices, etc.) on an integrated circuit chip. Each SHE-MTJ 520 can include an insulator layer 524 (also referred to as a tunneling barrier layer) between a free ferromagnetic layer 525 (also referred to herein as a free layer or a data store layer) at a first side and a pinned ferromagnetic layer 523 (also referred to herein as a pinned layer or a fixed ferromagnetic layer) at a second side. In one exemplary embodiment, the pinned ferromagnetic layer 523 can be, for example, a gadolinium (Gd), iron (Fe), and cobalt (Co) alloy layer. The insulator layer 524 (i.e., the tunneling barrier layer) can be, for example, any of a magnesium oxide (MgO) layer, an aluminum oxide ($Al_2O_3$) layer (also referred to as alumina) and a bismuth ferrite ($BiFeO_3$, also referred to as BFO) layer. The free ferromagnetic layer 525 can be, for example, a cobalt (Co), iron (Fe), boron (B) alloy layer.

Those skilled in the art will recognize that similar or the same materials may be used to form STT-MTJs, conventional SHE-MTJs and VCMA-assisted SHE-MTJs. However, performance may be optimized by, for example, using different thicknesses for the insulator layer 524 employed in the conventional SHE-MTJs as compared to the insulator layer 524 employed in VCMA-assisted SHE-MTJs.

Figure 6A:
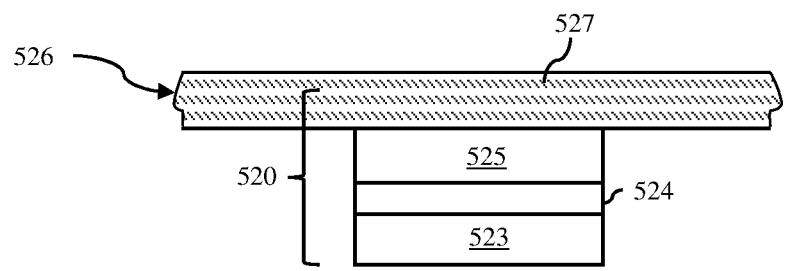
FIGS. 6A, 6B and 6C are cross-section drawings illustrating different configurations, respectively, for the first lines employed above the SHE-MTJs in any of the image sensor embodiments of shown in FIGS. 5A, 5B and 5C.
Figure 6B:
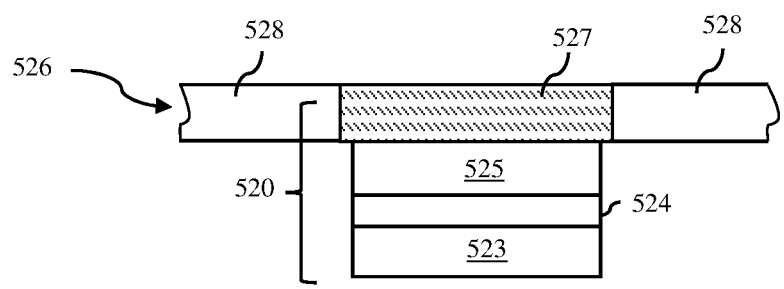
Figure 6C:
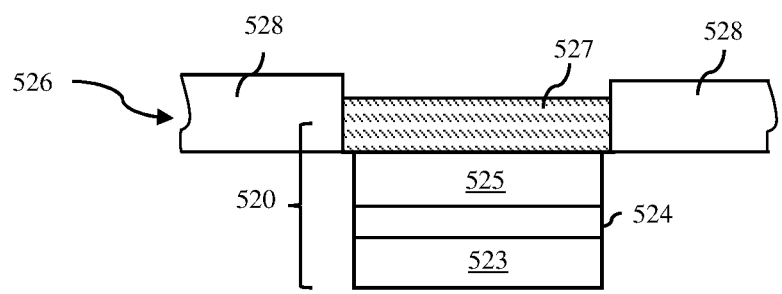

These image sensor embodiments 500A, 500B, and 500C can further include first lines 526. The first lines 526 can be immediately adjacent to the rows a-d of SHE-MTJs 520, respectively. Specifically, each first line 526 can traverse a corresponding row of SHE-MTJs such that it extends across and is in contact with the free layer 525 of each SHE-MTJ 520 in that corresponding row. The first lines 526 can be, for example, relatively thin and flat strips of material (also referred to as nanosheets) that are: (a) made up entirely of transparent conductive SHE material 527 (as shown in FIG. 6A) or (b) that have first sections, which are immediately adjacent to the free layers 525 of the SHE-MTJs 520 and which are made of the transparent conductive SHE material 527, and second sections, which are on opposing sides of the first sections (e.g., such that each first section is positioned laterally between two second sections) and which are made up of a metal or metal alloy material 528 for increased conductivity (as shown in FIG. 6B or 6C). In any case, the transparent conductive SHE material 527 can include be relatively thin (e.g., less than 3 nm) and can include, for example, a heavy metal (e.g., gadolinium, tantalum, platinum, tungsten, or any other suitable heavy metal having a density of at least 5 g/cm$^3$), graphene or any other suitable transparent conductive material that exhibits the spin hall effect. It should be noted that indium tin oxide (ITO) or zinc oxide (ZnO) could also be employed but those skilled in the art will recognize that these materials have a relatively low spin hall angle. In the case where the first lines 526 have first sections of transparent conductive SHE material 527 and second sections of a metal or metal alloy material 528, the metal or metal alloy material 528 can be, for example, copper, aluminum, or any other suitable BEOL metal or metal alloy material. Additionally, the first sections of the transparent conductive SHE material 527 and the second sections of the metal or metal alloy material 528 may have the same thicknesses (as shown in FIG. 6B) or different thicknesses (e.g., the second sections of the metal or metal alloy material 528 can be thicker than the first sections of the transparent conductive SHE material 527) (as shown in FIG. 6C).

These image sensor embodiments 500A, 500B, and 500C can further include second lines 521 of conductive material. The second lines 521 can be, for example, wires made of a metal or metal alloy (e.g., copper or any other suitable BEOL metal or metal alloy). The second lines 521 can be electrically connected (e.g., by local interconnects 522) to the MTJs in the columns A-D of SHE-MTJs, respectively. Specifically, each second line 521 can be electrically connected by a local interconnect 522 to the pinned layer 523 of each SHE-MTJ 520 in a corresponding column A-D.

Additionally, these image sensor embodiments 500A, 500B, and 500C can be configured so that both the first lines and the second lines are selectively biasable so as to enable performance of global reset, global sense and selective read operations with respect to the SHE-MTJs without the need for transistors (e.g., access transistors, etc.) for each SHE-MTJ.

Specifically, the image sensor embodiments 500A, 500B, and 500C can further include a controller 180 and peripheral circuitry 581-583. In response to control signals from the controller 180, the peripheral circuitry 581-583 can cause biasing of the first lines 126 and second lines 121, during global reset, global sense and selective read operations, as discussed below. Specifically, peripheral circuitry 581 and 582 can be connected to opposite ends of the first lines 526 for the rows and can include, for example, address decode logic and first line drivers for appropriately biasing the opposite ends of the first lines as discussed below. Peripheral circuitry 583 can be connected to the second lines 521 for the columns and can include column address decode logic and second line drivers for appropriately biasing the second lines as discussed below. Peripheral circuitry configured to selectively bias lines of an array in response to control signals from a controller are well known in the art. Thus, the details thereof have been omitted from this specification in order to allow the reader to focus on the salient aspects of the disclosed embodiments.

These image sensor embodiments 500A, 500B, and 500C can further be configured so that the first lines 526 are concurrently exposable to radiation (e.g., ambient radiation of different wavelengths) at least during the global sense operations. For example, the first lines 526 can be continuously exposed to ambient light either because the top surfaces of the first lines 526 are devoid of any other films or because the top surfaces of the first lines 126 are only covered by transparent films (as in the image sensor embodiment 500A of FIG. 5A). Alternatively, a single on-demand radiation shield that covers the entire array 510 (not illustrated) or multiple discrete on-demand radiation shields 530 can be aligned above the first lines 526, respectively. Such on-demand radiation shields can be configured to switch between opaque and transparent states in response to different biasing conditions (e.g., as applied by peripheral circuitry 581 and/or 582 in response to control signals from the controller 580) such that exposure of the first lines only occurs when needed (e.g., during the global sense operations). That is, in a first state under a first set of biasing conditions, the on-demand radiation shield(s) can be essentially opaque preventing transmission of radiation to the first lines 526, whereas, in a second state under a second set of biasing conditions that is different from the first set, the on-demand radiation shield(s) can be essentially transparent allowing concurrent exposure of the first lines 526 to radiation. FIG. 3 is a cross-section diagram illustrating an exemplary on-demand radiation shield (see the detail discussion of FIG. 3 above).

Figure 7A:
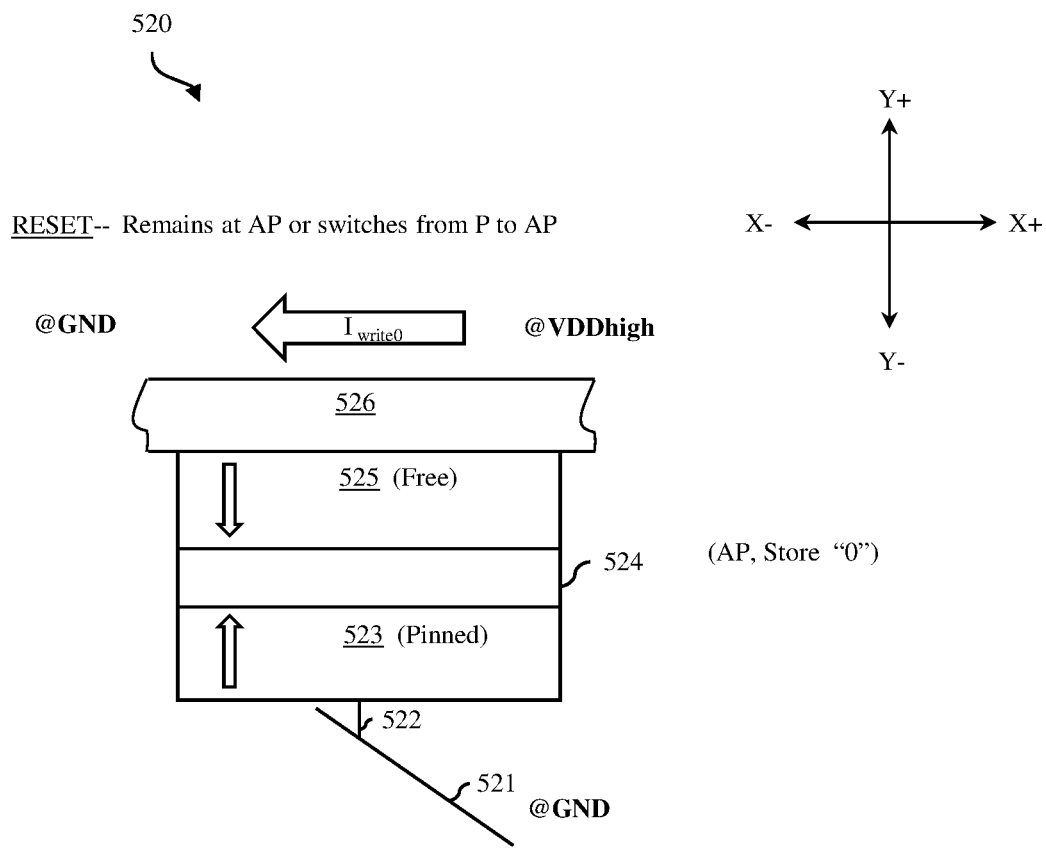
FIGS. 7A, 7B(1) and (2) and 7C illustrate an exemplary SHE-MTJ in any of the image sensor embodiments of FIGS. 5A, 1B and 5C during reset, sense and read operations, respectively.

FIG. 7A is a cross-section diagram illustrating an exemplary SHE-MTJ 520 during a global reset operation. For example, during a global reset operation, a first positive voltage (e.g., VDD high) can be applied to first ends of all of the first lines 526 (i.e., the transparent conducting SHE material), all the second ends of all of the first lines 526 opposite the first ends can be connected to ground, and all of the second lines 521 can also be connected to ground so that sufficiently high currents flow in a first direction (e.g., in the X− direction) across the first lines 526, thereby causing the SHE-MTJs to be concurrently reset to the anti-parallel (AP) state That is, in each SHE-MTJ, the polarity of the magnetism in the free layer 525 will remain in or switch to a second direction that is perpendicular to the first direction of the current flow through the first lines 526 and opposite the polarity of the magnetism in the pinned layer 523. For example, if the polarity of the magnetism in the pinned layer 523 of each SHE-MTJ is in the Y+ direction, causing current to flow across the first lines 526 (which contain the transparent conducting SHE material) in the X− direction can cause the polarity of magnetism in the free layer 525 to either remain in or switch to the Y− direction such that the same first data value (e.g., a "0") is concurrently stored in each of the SHE-MTJs 520 in the array 510.

FIGS. 7B(1) and 7B(2) are different cross-section diagrams illustrating an exemplary conventional SHE-MTJ or an exemplary VCMA-assisted SHE MTJ, respectively, during a global sense operation. During a global sense operation (also referred to herein as an image capture operation), all the first lines can be concurrently exposed to radiation 300, however, the biasing conditions will vary depending upon whether the SHE-MTJs are conventional SHE-MTJs or VCMA-assisted SHE-MTJs.

Specifically, with conventional SHE-MTJs (as shown in FIG. 7B(1)), a second positive voltage (e.g., VDD low) that is less than the first positive voltage (e.g., VDD high) can be applied to all second ends of the first lines 526, all first ends of the first lines 526 can be connected to ground and all the second lines 521 can be discharged to ground. Under these biasing conditions, low currents flow through the first lines 526 in the X+ direction. However, switching of any given conventional SHE-MTJ from the AP state to the parallel (P) state by switching the polarity of the magnetism in the free layer 525 to the same direction as the polarity of the magnetism in the pinned layer 523 (e.g., to the Y+ direction) so that the stored data value is switched from the first data value (e.g., a "0") to a second data value (e.g., a "1") will only occur when the actual luminous intensity level of radiation 300 received at an immediately adjacent first line portion is greater than a threshold luminous intensity level (i.e., actual candela ($Cd_a$)>threshold candela ($Cd_t$). That is, during the global sense operation, all the first lines 526 will be concurrently exposed to radiation 300 either because: (a) the top surfaces of the first lines 526 are continuously exposed regardless of the operation (e.g., as in the image sensor 500A) or (b) because the state of the on-demand radiation shield(s) 530 have been switched, on demand as discussed above, to allow transmission of radiation 300 (e.g., as in the image sensor 500B or 500C). Depending upon the particular image being captured during this global sense operation, the actual luminous intensity level of the radiation 300 received in any given area of the first lines 526 above any given conventional SHE-MTJ may vary. If the actual luminous intensity level of radiation 300 received at a specific first line portion, which is above and immediately adjacent to a specific SHE-MTJ, is less than a threshold luminous intensity level, then the combined energy from the low current flow in the X+ direction across the first lines 526 and the radiation 300 received at the specific first line portion will not be sufficient to cause the specific conventional SHE-MTJ adjacent thereto to switch from the AP state to the P state. That is, the specific conventional SHE-MTJ will continue to store the first data value (e.g., a "0"). However, if the actual luminous intensity level of radiation 300 received at a specific first line portion, which is above and immediately adjacent to a specific SHE-MTJ, is greater than a threshold luminous intensity level, then the combined energy from the low current flow in the X+ direction across the first lines 526, and the radiation 300 received at the specific first line portion will cause the specific SHE-MTJ to switch from the AP state to the P state (i.e., will cause the polarity of the magnetism in the free layer 525 to switch so that it is the same as the polarity of the magnetism in the pinned layer 523, e.g., in the Y+ direction). That is, the stored data value in the specific conventional SHE-MTJ will switch from the first data value (e.g., a "0") to the second data value (e.g., a "1").

With VCMA-assisted SHE-MTJs (as shown in FIG. 7B(2)), the first ends and the second ends of all of the first lines 526 can be electrically connected to ground and a voltage-controlled magnetic anisotropy (VCMA) voltage can be applied to all of the second lines. The VCMA voltage can be a high positive voltage and, particularly, at the same level or higher than the first positive voltage (e.g., VDD high) mentioned above. Under these biasing conditions, switching of a VCMA-assisted SHE-MTJ from the AP state to the parallel (P) state by switching the polarity of the magnetism in the free layer 525 to the same direction as the polarity of the magnetism in the pinned layer 523 (e.g., to the Y+ direction) so that the stored data value is switched from the first data value (e.g., a "0") to a second data value (e.g., a "1") will only occur when the actual luminous intensity level of radiation 300 received at an immediately adjacent first line portion is greater than a threshold luminous intensity level (i.e., actual candela ($Cd_a$)>threshold candela ($Cd_t$). That is, during the global sense operation, all the first lines 526 will be concurrently exposed to radiation 300 either because: (a) the top surfaces of the first lines 526 are continuously exposed regardless of the operation (e.g., as in the image sensor 500A) or (b) because the state of the on-demand radiation shield(s) 530 have been switched, on demand as discussed above, to allow transmission of radiation 300 (e.g., as in the image sensor 500B or 500C). Depending upon the particular image being captured during this global sense operation, the actual luminous intensity level of the radiation 300 received in any given area of the first lines 526 above any given VCMA-assisted SHE-MTJ may vary. If the actual luminous intensity level of radiation 300 received at a specific first line portion, which is above and immediately adjacent to a specific VCMA-assisted SHE-MTJ, is less than a threshold luminous intensity level, then the combined energy from the VCMA voltage applied to the second lines and the radiation 300 received at the specific first line portion will not be sufficient to cause the specific VCMA-assisted SHE-MTJ adjacent thereto to switch from the AP state to the P state. That is, the specific VCMA-assisted SHE-MTJ will continue to store the first data value (e.g., a "0"). However, if the actual luminous intensity level of radiation 300 received at a specific first line portion, which is above and immediately adjacent to a specific VCMA-assisted SHE-MTJ, is greater than a threshold luminous intensity level, then the combined energy from VCMA voltage applied to the second lines and the radiation 300 received at the specific first line portion will cause the specific VCMA-assisted SHE-MTJ to switch from the AP state to the P state (i.e., will cause the polarity of the magnetism in the free layer 525 to switch so that it is the same as the polarity of the magnetism in the pinned layer 523, e.g., in the Y+ direction). That is, the stored data value in the specific VCMA-assisted SHE-MTJ will switch from the first data value (e.g., a "0") to the second data value (e.g., a "1").

Thus, SHE-MTJs 520 (either conventional or Vvcma-assisted) in the array 510 are considered to be optically switchable during this global sense operation.

Optionally, the materials of the SHE-MTJs 520 and/or the biasing conditions employed during the global sense operation can be specifically selected so that the radiation-induced switching only occurs in response to radiation that is both over the threshold intensity value and within a specific range of wavelengths.

Figure 7C:
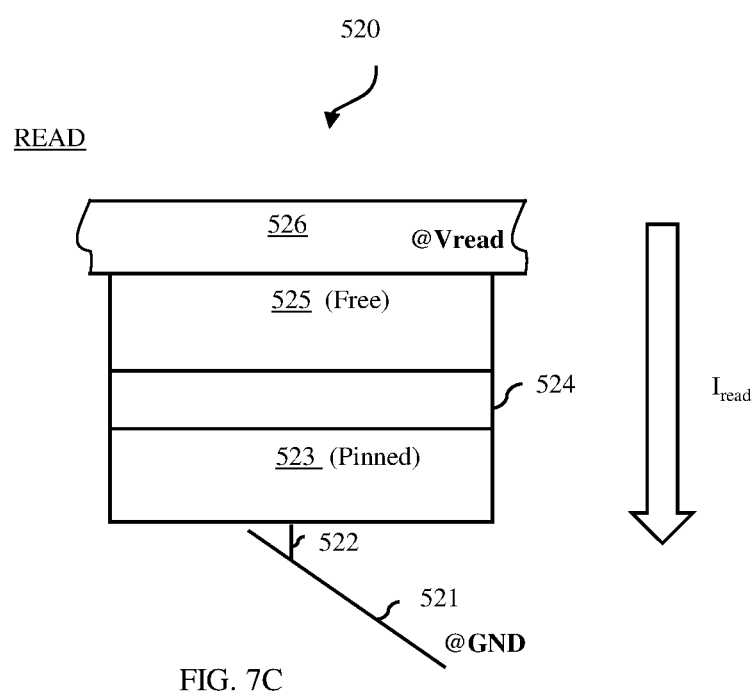

Selective read operations can subsequently be performed to read out pixel values corresponding to different locations of the image captured during the global sense operation. FIG. 7C is a cross-section diagram illustrating an exemplary SHE-MTJ 520 during a selective read operation.

In some image sensor embodiments (e.g., see the image sensor embodiments 500A of FIG. 5A and 500B of FIG. 5B), the pixels can be single-MTJ pixels such that, within the array 510, the number of columns of pixels and the number of rows of pixels are the same as the number of columns of SHE-MTJs and the number of rows of SHE-MTJs. In this case, the image sensors can include a sense circuit 590 and this sense circuit 590 can include amplifiers 591 (e.g., sense amplifiers or amplifiers of any other suitable type) electrically connected to the second lines 521, respectively. During a selective read operation of a selected single-MTJ pixel (which in this case is a read operation of the single SHE-MTJ therein), a read voltage (Vread) can be applied to opposing ends (i.e., to both the first end and the second end) of the specific first line 526 that is in contact with the SHE-MTJ of the selected single-MJT pixel (i.e., to the specific first line 526 for the row that contains the SHE-MTJ of the selected single-MJT pixel). Vread can be less than the voltage level required to switch the SHE-MTJ of the selected single-MTJ pixel from the AP state to the P state in the presence of radiation (as in the image sensor 500A) or, alternatively, in the absence of radiation when an on-demand radiation shield 530 is opaque (as in the image sensor 500B). All other first lines can be discharged to ground. As a result of these biasing conditions, the output of the specific amplifier 591 for the specific column that contains the SHE-MTJ of the selected single-MTJ pixel (i.e., the output of the specific amplifier 591 on the specific second line 521 that is electrically connected the SHE-MTJ of the selected single-MTJ pixel) will be indicative of the pixel value.

It should be noted that, given these biasing conditions, concurrent read operations of the pixel values read as the stored data values of all single SHE-MTJs of all single-MJT pixels in a given row of pixels can be performed.

Alternatively, in other image sensor embodiments (e.g., see the image sensor embodiment 500C of FIG. 5C), the pixels can be multi-MTJ pixels. That is, each pixel corresponding to a given location of the image captured during the global sense operation can be associated with multiple SHE-MTJs 520. For example, each multi-MTJ pixel 529 corresponding to a given location of the image captured during the global sense operation can be associated with two or more adjacent SHE-MTJs 520 from two or more adjacent columns and/or two or more adjacent SHE-MTJs 520 from two or more adjacent rows. For purposes of illustration, in FIG. 5C, each multi-MTJ pixel 529 is associated with four SHE-MTJs include two from adjacent columns of SHE-MTJs and two from adjacent rows of SHE-MTJs. Thus, the exemplary array 510 that has four columns A-D of SHE-MTJs and four rows a-d of SHE-MTJs, will have only two columns of pixels and two rows of pixels. In this case, the sense circuit 590' can include switches 592 (e.g., transmission gates) between adjacent second lines in the sets of second lines that associated with each of the columns of pixels, respectively. That is, each pair of adjacent second lines in a given set of second lines that is associated with a given column of pixels will be electrically connectable (on-demand) through the use of a switch 592 (e.g., a transmission gate). The sense circuit 590' can further include amplifiers 591 (e.g., sense amplifiers or amplifiers of any other suitable type) that are electrically connected to the sets of the second lines, respectively. That is, each amplifier 591 can be electrically connected to a given set of second lines that is associated with a given column of pixels. During a selective read operation of a selected multi-MTJ pixel 529 (which in this case is a read operation of the combined value of the stored data values in four adjacent SHE-MTJs), the switches 592 will turn on in response to one or more control signals (e.g., in response to an enable signal and an inverted enable signal) from the controller 580, thereby electrically connecting the adjacent second lines within each given set of second lines associated with each given column of pixels. Then, a read voltage (Vread) can be applied to the opposing ends of only those first lines 526 that are in contact with the SHE-MTJs of the selected multi-MTJ pixel 529. Vread can be less than the voltage level required to switch any of the SHE-MTJs in the selected multi-MTJ pixel 529 from the AP state to the P state in the presence of radiation (e.g., when no radiation shield is present (not shown)) or, alternatively, in the absence of radiation when an on-demand radiation shield 530 is opaque (as in the image sensor 100C). All other first lines can be discharged to ground. As a result of turning on the switches 592 and further as a result of the biasing conditions, the output of the specific amplifier 591 for the specific column of pixels that contains the selected multi-MTJ pixel 529 will be indicative of a combined value of the stored data values of all of the SHE-MTJs in the selected multi-MTJ pixel 529.

By considering the results of the switching behavior of all SHE-MTJs in a multi-MTJ pixel in response to exposure to radiation during a global sense operation instead of the switching behavior of only a single SHE-MTJ in a single-MTJ pixel, image capture accuracy can be statistically improved. That is, instead of associating a given location of a captured image with high intensity light when the SHE-MTJ of a single-MTJ pixel switches a stored data value in response to exposure to radiation during a global sense operation, accuracy is improved by associating the given location with high intensity light only when at least half of a group of adjacent SHE-MTJs of a multi-MJT pixel switch their stored data values. In the former case, if the SHE-MJT of the single-MJT pixel switches its' stored data value in error, then the value associated with the pixel will be wrong. In the latter case, if only one of the SHE-MJTs of the multi-MJT pixel switches its' stored data value in error, the value associated with the pixel will still be correct. It should be noted that, given the above-mentioned biasing conditions, concurrent read operations of the pixel values of all multi-MJT pixels in a given row of pixels can be performed. In any case, during selective read operations, the values read out from a single-MTJ pixel or a multi-MTJ pixel will be binary indicating either the presence or absence of a high intensity light (optionally of a particular color).

Optionally, with regard to multi-MJT pixels, the different SHE-MTJs within a given group (i.e., within a multi-MTJ pixel) can be configured so as to have different energy-barriers. For example, the SHE-MTJs within each multi-MTJ pixel could have different cross-section areas, respectively. In this case, an analog intensity of incident radiation can be sensed by probing the overall number of SHE-MTJs within a group that switched during the global sense operation.

In each of the above-described image sensor embodiments (e.g., image sensor embodiments 100A-100C of FIGS. 1A-1C and image sensor embodiments 500A-500C of FIGS. 5A-5C), during a global sense operation, all MTJs 120, 520 in an array 110, 510 are concurrently exposed to radiation and, upon application of the specific biasing conditions applied to the first and second lines, only MTJs that are receiving radiation above a threshold luminous intensity level concurrently switch states from AP to P. The state of the array 110, 510 during which the MTJs are concurrently exposed to radiation and concurrently switchable depending upon the intensity of the radiation is referred to herein as the global shutter effect. This global shutter effect is achievable as a result of the specific biasing conditions applied to the first lines and second lines during the global sense operation (as discussed above). Other biasing conditions and, particularly, the specific biasing conditions applied to the first lines and the second lines during reset and read operations (as described above) would not be sufficient to enable such optical switching given the MTJ structures. In any case, the global shutter effect can be enhanced and, particularly, better defined through the use of the on-demand radiation shield 130, 530, which specifically limits the time of radiation exposure.

Advantages of the above-described image sensor embodiments (e.g., image sensor embodiments 100A-100C of FIGS. 1A-1C and image sensor embodiments 500A-500C of FIGS. 5A-5C) include the fact that the MTJs (e.g., either the STT-MTJs or the SHE-MTJs) are able to store sensed image data, which has been captured during a global sense operation, until such time as a global reset operation is performed and without leakage concerns. That is, the array has intrinsic memory storage and is radiation hardened so there is no requirement that the captured data be immediately read or to avoid data loss. Additionally, MTJs are relatively small back-end-of-the-line (BEOL) data storage devices and, unlike conventional image sensors that require multiple front-end-of-the-line(FEOL) devices per pixel within the array (e.g., a relatively large photodiode and at least three transistors per pixel), the disclosed image sensor embodiments do not require FEOL devices within the array 110, 510. Thus, the disclosed image sensor embodiments consume a significantly smaller amount of chip area (e.g., less than 0.022 $\mu m^2$) relative to the chip area consumed by a conventional image sensor (e.g., approximately 2-4 $\mu m^2$).

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A sensor comprising:
   an array of magnetic tunnel junctions arranged in columns and rows, wherein the magnetic tunnel junctions comprise spin hall effect-type magnetic tunnel junctions comprising an insulator layer between a free layer and a pinned layer;
   first lines comprising transparent conductive spin hall effect material, wherein each first line traverses, is in contact with the free layer of each magnetic tunnel junction in a corresponding row, and is exposable to radiation; and
   second lines, wherein each second line is electrically connected to the pinned layer of each magnetic tunnel junction in a corresponding column, and wherein the magnetic tunnel junctions are configured to store data values that are dependent on intensity levels of the radiation received at immediately adjacent portions of the first lines during a sense operation.

2. The sensor of claim 1, wherein the transparent conductive spin hall effect material comprises a heavy metal or graphene with a thickness that is less than 3 nm.

3. The sensor of claim 1, wherein each first line comprises: first sections comprising the transparent conductive spin hall effect material in contact with the free layer of each magnetic tunnel junction in the corresponding row; and second sections on opposing sides of the first sections and comprising a metal or metal alloy material.

4. The sensor of claim 1, further comprising: a controller; and peripheral circuitry in communication with the controller and configured to selectively bias the first lines and the second lines in response to control signals from the controller.

5. The sensor of claim 4,
   wherein the peripheral circuitry applies a first positive voltage to first ends of all the first lines, connects second ends of all the first lines opposite the first ends to ground, and connects all the second lines to ground, during a global reset operation, so that all of the magnetic tunnel junctions in the array concurrently store first data values, and
   wherein the peripheral circuitry applies a second positive voltage that is less than the first positive voltage to the second ends of all the first lines, connects the first ends of all the first lines to ground, and connects all the second lines to ground, during a global sense operation, so that, in response to all of the first lines being concurrently exposed to radiation, switching of a first data value to a second data value only occurs in a given magnetic tunnel junction when an actual intensity level of the radiation received at an immediately adjacent first line portion is greater than a threshold intensity level.

6. The sensor of claim 5,
   wherein a pixel comprises a single magnetic tunnel junction,
   wherein the sensor further comprises amplifiers electrically connected to the second lines, respectively, and
   wherein the peripheral circuitry applies a read voltage to a first line in contact with the single magnetic tunnel junction of a selected pixel and connects all other first lines to ground, during a selective read operation, such that an output of an amplifier on a second line electrically connected the single magnetic tunnel junction is indicative of a stored data value in the single magnetic tunnel junction.

7. The sensor of claim 5,
wherein a pixel comprises a group of at least two magnetic tunnel junctions such that the array of magnetic tunnel junction comprises an array of pixels arranged in columns and rows,
wherein the sensor further comprises:
    switches between adjacent second lines in sets of second lines associated with the columns of the pixels, respectively; and
    amplifiers electrically connected to the sets of the second lines, respectively and
wherein the switches turn on in response to enable signals from the controller and electrically connect the second lines within each set and the peripheral circuitry applies a read voltage to all first lines that are in contact with any magnetic tunnel junctions of a selected pixel, and further connects all other first lines to ground, during a selective read operation, such that an output of an amplifier connected to a set of the second lines that are electrically connected to the magnetic tunnel junctions of the selected pixel is indicative of a combine data value for all of the magnetic tunnel junctions in the selected pixel.

8. The sensor of claim 1, further comprising at least one on-demand radiation shield that is selectively operable in a first state and a second state, wherein, in the first state, the at least one on-demand radiation shield is essentially opaque preventing transmission of the radiation to the first lines, and wherein, in the second state, the at least one on-demand radiation shield is essentially transparent allowing concurrent exposure of the first lines to radiation.

9. A sensor comprising:
an array of magnetic tunnel junctions arranged in columns and rows, wherein the magnetic tunnel junctions comprise an insulator layer between a free layer and a pinned layer;
first lines comprising transparent conductive material, wherein each first line traverses and is in contact with the free layer of each magnetic tunnel junction in a corresponding row; and
second lines, wherein each second line is electrically connected to the fixed pinned layer of each magnetic tunnel junction in a corresponding column, and wherein the magnetic tunnel junctions concurrently store image data in response to specific biasing conditions on the first lines and the second lines and concurrent exposure of the first lines to radiation.

10. The sensor of claim 9, wherein each first line comprises: first sections comprising the transparent conductive material in contact with the free layer of each magnetic tunnel junction in the corresponding row; and second sections on opposing sides of the first sections and comprising a metal or metal alloy material.

11. The sensor of claim 9, wherein the magnetic tunnel junctions comprise spin transfer torque-type magnetic tunnel junctions.

12. The sensor of claim 11, wherein the transparent conductive material comprises any of indium tin oxide (ITO), zinc oxide (ZnO), and graphene.

13. The sensor of claim 11, further comprising: a controller; and peripheral circuitry in communication with the controller and configured to selectively bias the first lines and the second lines in response to control signals from the controller.

14. The sensor of claim 13,
wherein the peripheral circuitry connects all the first lines to ground and applies a first positive voltage to all the second lines, during a global reset operation, so that all the magnetic tunnel junctions in the array concurrently store first data values, and
wherein the peripheral circuitry applies a second positive voltage that is less than the first positive voltage to all the first lines and connects all the second lines to ground, during a global sense operation, so that, in response to all of the first lines being concurrently exposed to radiation, switching of a first data value to a second data value only occurs in a given magnetic tunnel junction when an actual intensity level of the radiation received at an immediately adjacent first line portion is greater than a threshold intensity level.

15. The sensor of claim 13,
wherein a pixel comprises a single magnetic tunnel junction,
wherein the sensor further comprises amplifiers electrically connected to the second lines, respectively, and
wherein the peripheral circuitry applies a read voltage to a first line in contact with the single magnetic tunnel junction of a selected pixel and connects all other first lines to ground, during a selective read operation, such that an output of an amplifier on a second line electrically connected to the single magnetic tunnel junction is indicative of a stored data value in the single magnetic tunnel junction.

16. The sensor of claim 13,
wherein a pixel comprises a group of at least two magnetic tunnel junctions such that the array of magnetic tunnel junction comprises an array of pixels arranged in columns and rows,
wherein the sensor further comprises:
    switches between adjacent second lines in sets of second lines associated with the columns of the pixels, respectively; and
    amplifiers electrically connected to the sets of the second lines, respectively, and
wherein the switches turn on in response to enable signals from the controller and electrically connect the second lines within each set and the peripheral circuitry applies a read voltage to all first lines that are in contact with any magnetic tunnel junctions of a selected pixel and connects all other first lines to ground, during a selective read operation, such that an output of an amplifier connected to a set of the second lines that are electrically connected to the magnetic tunnel junctions of the selected pixel is indicative of a combine data value for all of the magnetic tunnel junctions in the selected pixel.

17. The sensor of claim 13, further comprising at least one on-demand radiation shield operable in a first state and a second state wherein, in the first state, the at least one on-demand radiation shield is essentially opaque preventing transmission of the radiation to the first lines, and wherein, in the second state, the at least one on-demand radiation shield is essentially transparent allowing concurrent exposure of the first lines to radiation.

18. A sensor comprising:
an array of magnetic tunnel junctions arranged in columns and rows, wherein the magnetic tunnel junctions comprise an insulator layer between a free layer and a pinned layer;
first lines comprising transparent conductive material, wherein each first line traverses and is in contact with the free layer of each magnetic tunnel junction in a corresponding row;
second lines, wherein each second line is electrically connected to the fixed pinned layer of each magnetic tunnel junction in a corresponding column; and
peripheral circuitry connected to the first lines and the second lines,
wherein the peripheral circuitry applies a first set of biasing conditions to the first lines and the second lines to concurrently store first data values in the magnetic tunnel junctions, and
wherein the peripheral circuitry applies a second set of biasing conditions to the first lines and the second lines so that, in response to all of the first lines being concurrently exposed to radiation, switching of a first data value to a second data value only occurs in a given magnetic tunnel junction when an actual intensity level of the radiation received at an immediately adjacent first line portion is greater than a threshold intensity level.

19. The sensor of claim 18, wherein the magnetic tunnel junctions comprise spin transfer torque-type magnetic tunnel junctions and wherein the transparent conductive material comprises any of indium tin oxide (ITO), zinc oxide (ZnO), and graphene.

20. The sensor of claim 18, wherein the magnetic tunnel junctions comprise spin hall effect-type magnetic tunnel junctions, and wherein the transparent conductive material comprises a transparent conductive spin hall effect material comprising a heavy metal or graphene with a thickness that is less than 3 nm.

* * * * *